(12) United States Patent
Lee

(10) Patent No.: US 9,852,964 B2
(45) Date of Patent: Dec. 26, 2017

(54) THROUGH-BODY VIA FORMATION TECHNIQUES

(71) Applicant: INTEL CORPORATION, Santa Clara, CA (US)

(72) Inventor: Kevin J. Lee, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/116,435

(22) PCT Filed: Mar. 24, 2014

(86) PCT No.: PCT/US2014/031604
§ 371 (c)(1),
(2) Date: Aug. 3, 2016

(87) PCT Pub. No.: WO2015/147785
PCT Pub. Date: Oct. 1, 2015

(65) Prior Publication Data
US 2017/0011987 A1      Jan. 12, 2017

(51) Int. Cl.
*H01L 23/48*    (2006.01)
*H01L 25/065*   (2006.01)
(Continued)

(52) U.S. Cl.
CPC .......... *H01L 23/481* (2013.01); *H01L 21/288* (2013.01); *H01L 21/76829* (2013.01);
(Continued)

(58) Field of Classification Search
CPC ....... H01L 2924/00014; H01L 2924/00; H01L 2224/73204; H01L 2924/0002; H01L 2224/16225
(Continued)

(56) References Cited

U.S. PATENT DOCUMENTS

2005/0136635 A1*  6/2005  Savastiouk ............. H01L 23/13
                                                 438/597
2007/0117348 A1*  5/2007  Ramanathan ..... H01L 21/76898
                                                 438/455
(Continued)

FOREIGN PATENT DOCUMENTS

JP    2012015209 A    1/2012
JP    2012195383 A    10/2012
WO    2015147785 A1   10/2015

OTHER PUBLICATIONS

International Search Report and Written Opinion as received for Patent Application No. PCT/US2014/031604, dated Dec. 23, 2014, 11 pages.
(Continued)

*Primary Examiner* — Jonathan Han
(74) *Attorney, Agent, or Firm* — Finch & Maloney PLLC

(57) ABSTRACT

Techniques are disclosed for forming a through-body-via (TBV) in a semiconductor die. In accordance with some embodiments, a TBV provided using the disclosed techniques includes a polymer-based barrier layer and an electrically conductive seed layer formed by applying an electrically conductive ink directly to the barrier layer and then curing it in situ. In some embodiments, after curing, the resultant seed layer may be a thin, substantially conformal, electrically conductive metal film over which the TBV interconnect metal can be deposited. In some example cases, a polyimide, parylene, benzocyclobutene (BCB), and/or polypropylene carbonate (PPC) barrier layer and an ink containing copper (Cu) and/or silver (Ag), of nanoparticle-based or metal complex-based formulation, may be used in forming the TBV. In some instances, the disclosed techniques may be used to address poor step coverage, low run rate, and/or high cost issues associated with existing physi-
(Continued)

cal vapor deposition (PVD)-based far-back-end-of-line (FBEOL) processes.

25 Claims, 9 Drawing Sheets

(51) Int. Cl.
*H01L 21/768* (2006.01)
*H01L 23/00* (2006.01)
*H01L 21/288* (2006.01)
*H01L 23/532* (2006.01)

(52) U.S. Cl.
CPC .. *H01L 21/76873* (2013.01); *H01L 21/76898* (2013.01); *H01L 23/5329* (2013.01); *H01L 23/53209* (2013.01); *H01L 23/53238* (2013.01); *H01L 24/02* (2013.01); *H01L 24/05* (2013.01); *H01L 25/0657* (2013.01); *H01L 21/76831* (2013.01); *H01L 2224/02372* (2013.01); *H01L 2224/05008* (2013.01); *H01L 2224/05022* (2013.01); *H01L 2224/05569* (2013.01); *H01L 2225/06544* (2013.01)

(58) Field of Classification Search
USPC .......................... 257/774, E21.577–E21.578, 257/E21.585–E21.588; 438/637–640, 668
See application file for complete search history.

(56) References Cited

U.S. PATENT DOCUMENTS

| 2008/0079121 | A1  | 4/2008 | Han |
| 2011/0101532 | A1  | 5/2011 | Pohl et al. |
| 2012/0074584 | A1* | 3/2012 | Lee .................. H01L 21/76898 257/774 |
| 2013/0062736 | A1  | 3/2013 | Brighton et al. |
| 2013/0209672 | A1* | 8/2013 | Reinmuth ............ H05K 3/4061 427/97.8 |
| 2014/0247269 | A1* | 9/2014 | Berdy ...................... H01F 1/24 345/501 |
| 2014/0264921 | A1* | 9/2014 | Gao .................. H01L 21/76898 257/774 |

OTHER PUBLICATIONS

International Preliminary Report on Patentability received for Patent Application No. PCT/US2014/031604. dated Oct. 6, 2016. 8 pages.
Extended European Search Report received for EP Application No. 14886882.1, dated Oct. 19, 2017. 8 pages.
Xiao, et al., "Conductive Ink for Through Hole Application," Electronic Components and Technology Conference, 2000. Pages 882-886.

* cited by examiner

THROUGH-BODY VIA FORMATION TECHNIQUES

BACKGROUND

A through-silicon via (TSV) is a vertical electrical connection that passes through a silicon (Si) substrate (e.g., silicon wafer/die) from an upper surface thereof to an opposing lower surface thereof. Typically, a TSV is formed by first etching the Si substrate to define a through-hole passing from the upper surface to the opposing lower surface. Then, a layer of dielectric material, such as silicon dioxide ($SiO_2$), is deposited along the interior sidewall surface(s) of the through-hole in the substrate. Finally, an electrically conductive material, such as copper (Cu), is deposited in the remainder of the through-hole to provide an electrical connection between the upper and lower surfaces of the substrate. TSVs may be used to interconnect multiple active circuit layers (e.g., stacked chips) in a single chip or multiple dies, thereby forming a three-dimensional integrated circuit (3D IC) or other three-dimensional package.

Figure 1A:
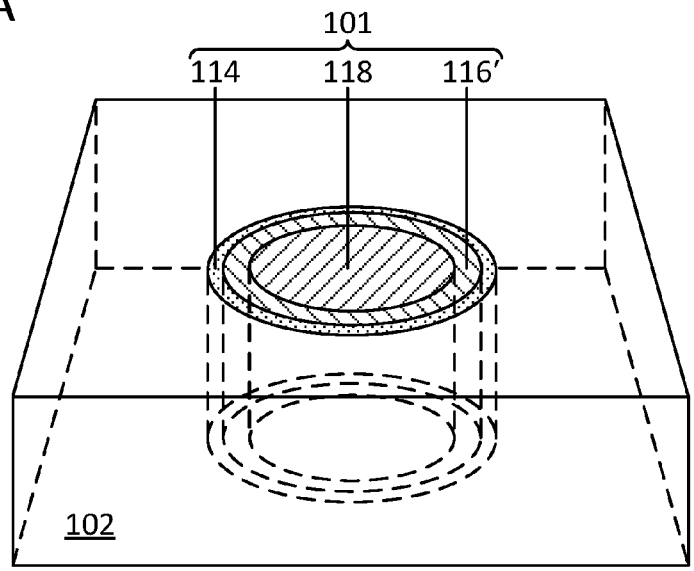
FIGS. 1A-1C illustrate perspective, side cross-sectional, and top views, respectively, of a through-body-via (TBV) configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for forming a through-body-via (TBV) in a semiconductor die. In accordance with some embodiments, a TBV provided using the disclosed techniques includes a polymer-based barrier layer and an electrically conductive seed layer formed by applying an electrically conductive ink directly to the barrier layer and then curing it in situ. In some embodiments, after curing, the resultant seed layer may be a thin, substantially conformal, electrically conductive metal film over which the interconnect metal of the TBV can be deposited. In some example cases, a polyimide, parylene, benzocyclobutene (BCB), and/or polypropylene carbonate (PPC) barrier layer and an ink containing copper (Cu) and/or silver (Ag), of nanoparticle-based or metal complex-based formulation, may be used in forming the TBV. In some instances, the disclosed techniques may be used to address the noted poor step coverage, low run rate, and/or high cost issues associated with existing physical vapor deposition (PVD)-based far-back-end-of-line (FBEOL) processes. Numerous configurations and variations will be apparent in light of this disclosure.

General Overview

In existing processes for fabricating far-back-end copper (Cu) vias, an electrically conductive seed layer film is deposited onto a titanium (Ti) or tantalum (Ta) barrier film using physical vapor deposition (PVD) techniques. However, PVD provides poor step coverage of the deposited film over high-aspect-ratio features. As a consequence, it is normally necessary to deposit very thick layers of these materials so as to achieve even minimally acceptable sidewall coverage, and this in turn causes the run rate for the PVD barrier and seed layer depositions to be very slow and the fabrication cost to be very high. In addition, care must be taken so as not to occlude the openings of such features during these deposition processes. Continued process scaling will tend to exacerbate such complications. Currently, there are no known solutions to these issues with PVD seed layer deposition in far-back-end-of-line (FBEOL) silicon processing.

Thus, and in accordance with some embodiments of the present disclosure, techniques are disclosed for forming a through-body-via (TBV) in a semiconductor die. In accordance with some embodiments, a TBV provided using the disclosed techniques includes a polymer-based barrier layer and an electrically conductive seed layer formed by applying an electrically conductive ink directly to the barrier layer and then curing it in situ. In some embodiments, after curing, the resultant seed layer may be a thin, substantially conformal, electrically conductive metal film over which the interconnect metal of the TBV can be deposited. In some example cases, a polyimide, parylene, benzocyclobutene (BCB), and/or polypropylene carbonate (PPC) barrier layer and an ink containing copper (Cu) and/or silver (Ag), of nanoparticle-based or metal complex-based formulation, may be used in forming the TBV. In some instances, the disclosed techniques may be used to address the noted poor step coverage, low run rate, and/or high cost issues associated with existing physical vapor deposition (PVD)-based far-back-end-of-line (FBEOL) processes.

A TBV configured as described herein may extend through the body of a host die such that its terminals are accessible on the upper and/or lower surfaces thereof. Thus, in some cases, the host die can be electrically connected with another die to provide a die stack or other three-dimensional integrated circuit (3D IC), in accordance with some embodiments. For instance, in some cases, a TBV configured as described herein can be electrically connected with other circuit components of a host die stack through the one or more redistribution layers (RDLs) thereof. In some other cases, the disclosed TBV can be electrically connected, for example, using the active metal layer of the host die stack. In some instances, a TBV configured as described herein can be utilized, for example, to electrically connect the one or more interconnect layers on the active front-side of a first die with the one or more interconnect layers on the active front-side of a second, adjacent die. Numerous suitable configurations will be apparent in light of this disclosure.

Also, in accordance with some embodiments, use of the disclosed techniques may be detected, for example, by visual or other inspection (e.g., cross-sectional scanning electron microscopy, or SEM; etc.) of a given integrated circuit or other device having a through-body-via (TBV) including a polymer-based barrier layer configured as described herein. In some cases, use of the disclosed techniques may be detected, for example, upon observing an electrically conductive seed layer that is different in material composition from the electrically conductive interconnect of the TBV and/or any RDL optionally electronically coupled therewith.

Structure

Figure 1B:
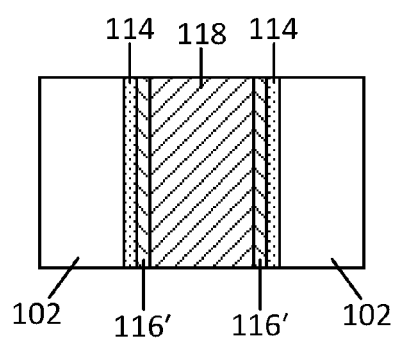
Figure 1C:
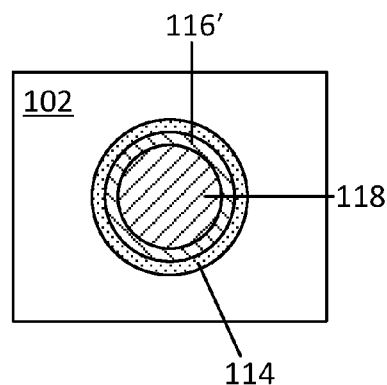

FIGS. 1A-1C illustrate several views of a through-body-via (TBV) 101, configured in accordance with an embodiment of the present disclosure. As discussed herein, TBV 101 may include a barrier layer 114 formed within a semiconductor layer 102. Also, TBV 101 may include an electrically conductive seed layer 116' formed over the barrier layer 114 (e.g., within an interior region bounded by barrier layer 114). TBV 101 further may include an interconnect 118 (e.g., a via or other suitable single-damascene or dual-damascene interconnect) formed over seed layer 116' (e.g., within an interior region bounded by seed layer 116'). Barrier layer 114, seed layer 116', and interconnect 118 may be arranged in a generally concentric configuration, as generally shown in FIGS. 1A-1C, in accordance with some embodiments. Other suitable configurations for TBV 101 will be apparent in light of this disclosure.

Also, as discussed herein, TBV 101 can be provided with any of a wide variety of electrical connections. In accordance with some embodiments, a TBV 101 configured as described herein can be electrically connected with upper and/or lower circuit dies (e.g., in a 3D die stack), as desired for a given target application or end-use. For example, in accordance with some embodiments, a TBV 101 can be provided with connections through one or more redistribution layers (RDLs) of a three-dimensional die stack. In accordance with some other embodiments, a TBV 101 can be connected using the active metal layer of a three-dimensional die stack. In some instances, a TBV 101 can be provided with active side connections, for example, to active circuit parts of a lower die. As will be further appreciated in light of this disclosure, a TBV 101 configured as described herein can have any of a wide range of applications.

Methodology

FIGS. 2-15 illustrate an integrated circuit (IC) fabrication process flow, in accordance with an embodiment of the present disclosure. As discussed herein, the disclosed techniques can be used, in accordance with some embodiments, to provide an IC 100 including one or more through-body-vias (TBVs) 101. As will be appreciated in light of this disclosure, the disclosed process flow can be considered, in a general sense, a via-middle (e.g., as opposed to a via-first or a via-last) process flow for forming a TBV 101.

Figure 2:
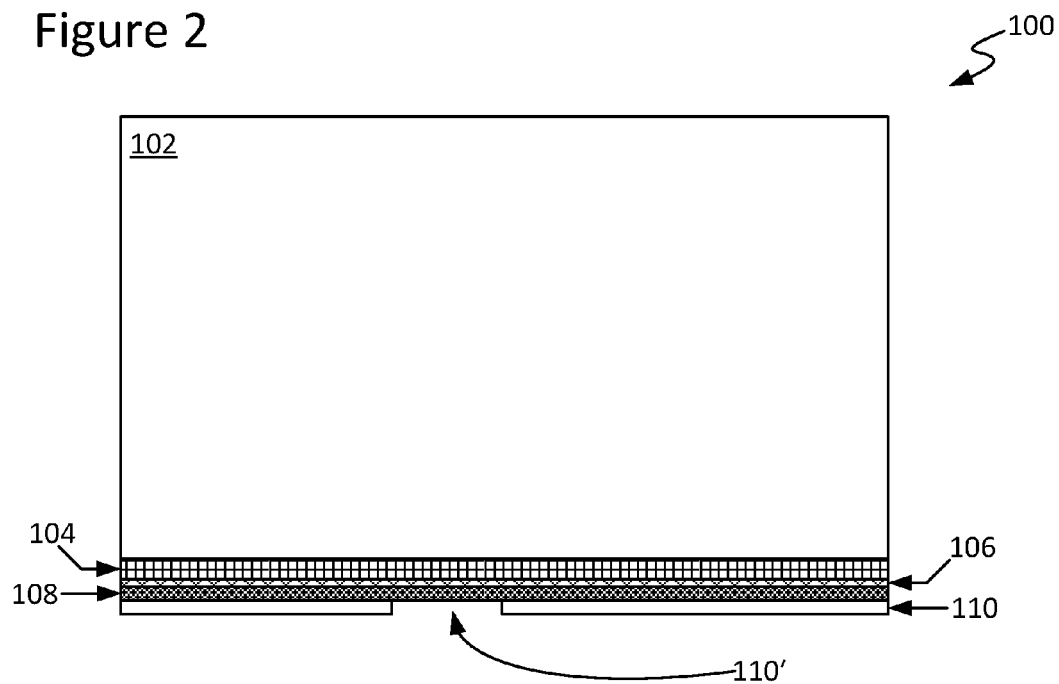
FIG. 2 is a cross-sectional view of an integrated circuit (IC), in accordance with an embodiment of the present disclosure.

The process may begin as in FIG. 2, which is a cross-sectional view of an integrated circuit (IC) 100, in accordance with an embodiment of the present disclosure. As can be seen, IC 100 initially may include a semiconductor layer 102. Semiconductor layer 102 can be formed from any suitable semiconductor material (or combination of such materials), such as silicon (Si) and/or silicon germanium (SiGe). Semiconductor layer 102 can have any of a wide range of configurations, including, for example: a bulk semiconductor substrate; a silicon-on-insulator (SOI) structure; a semiconductor wafer; and/or a multi-layered structure. Furthermore, the dimensions of semiconductor layer 102 can be customized for a given target application or end-use. As will be appreciated in light of this disclosure, it may be desirable to ensure that semiconductor layer 102 is of sufficient thickness, for example, to permit formation of one or more TBVs 101, which are of sufficient dimensions for a given target application or end-use. Other suitable materials, configurations, and dimensions for semiconductor layer 102 will depend on a given application and will be apparent in light of this disclosure.

Also, as can be seen, IC 100 initially may include one or more front-end transistor layers 104 formed over semiconductor layer 102. Together, semiconductor layer 102 and the one or more front-end layers 104 may provide, in some cases, a partially completed device wafer that is available for downstream use and/or further processing. For example, in accordance with some embodiments, semiconductor layer 102 and front-end layer(s) 104 may provide a structure upon which an additional layer and/or component can be populated.

As can be seen further from FIG. 2, a polish stop layer 106 can be formed over the surface of IC 100 (e.g., over the one or more front-end layers 104). Polish stop layer 106 can be formed from any suitable polish stop material (or combination of such materials), using any of a wide range of techniques. For example, in some cases, polish stop layer 106 may be formed from: silicon nitride (Si$_3$N$_4$); silicon carbide (SiC); and/or a combination of any thereof. In some cases, it may be desirable to select a polish stop layer 106 that has sufficient selectivity, for example, to chemical-mechanical planarization (CMP) slurries (or other planarization/polishing processes) which may be utilized in the disclosed process flow. In accordance with some example embodiments, polish stop layer 106 may be formed using a chemical vapor deposition (CVD) process, such as plasma-enhanced CVD (PECVD). Other suitable materials and techniques for forming polish stop layer 106 will depend on a given application and will be apparent in light of this disclosure.

Furthermore, the dimensions of polish stop layer 106 can be customized as desired for a given target application or end-use. For example, in some embodiments, polish stop layer 106 may have a thickness in the range of about 30-3,000 nm (e.g., about 30-1,000 nm, about 1,000-2,000 nm, about 2,000-3,000 nm, or any other sub-range in the range of about 0.1-1.0 µm). In some instances, polish stop layer 106 may have a substantially uniform thickness over the topography provided, for example, by any underlying layers of IC 100 (e.g., the one or more front-end layers 104). In some instances, polish stop layer 106 may be provided as a substantially conformal layer over such topography. In some other instances, polish stop layer 106 may be provided with a non-uniform or otherwise varying thickness over such topography. For example, in some cases a first portion of polish stop layer 106 may have a thickness within a first range while a second portion thereof has a thickness within a second, different range. Other suitable dimensions for polish stop layer 106 will depend on a given application and will be apparent in light of this disclosure.

Additionally, as can be seen from FIG. 2, a hardmask layer 108 can be formed over the surface of IC 100 (e.g., over polish stop layer 106). Hardmask layer 108 can be formed from any suitable hardmask material (or combination of such materials), using any of a wide range of techniques. For example, in some cases, hardmask layer 108 may be formed from: silicon dioxide (SiO$_2$); silicon nitride (Si$_3$N$_4$); silicon oxynitride (SiO$_x$N$_y$); and/or a combination of any one or more thereof. In accordance with some embodiments, hardmask layer 108 may be formed using: a chemical vapor deposition (CVD) process; a spin-on deposition (SOD) process; and/or a combination of any one or more thereof. Other suitable materials and techniques for forming hardmask layer 108 will depend on a given application and will be apparent in light of this disclosure.

Furthermore, the dimensions of hardmask layer 108 can be customized as desired for a given target application or end-use. For example, in some embodiments, hardmask layer 108 may have a thickness in the range of about 1.0-5.0 µm (e.g., about 1.0-2.5 µm, about 2.5-5.0 µm, or any other sub-range in the range of about 1.0-5.0 µm). In some instances, the thickness of hardmask layer 108 may be selected, at least in part, based on the desired depth of the one or more openings 112 (discussed below) to be etched into IC 100. In some instances, hardmask layer 108 may have a substantially uniform thickness over the topography provided, for example, by any underlying layers of IC 100 (e.g., polish stop layer 106). In some instances, hardmask layer 108 may be provided as a substantially conformal layer over such topography. In some other instances, hardmask layer 108 may be provided with a non-uniform or otherwise varying thickness over such topography. For example, in some cases a first portion of hardmask layer 108 may have a thickness within a first range while a second portion thereof has a thickness within a second, different range. Other suitable dimensions for hardmask layer 108 will depend on a given application and will be apparent in light of this disclosure.

As can be seen further from FIG. 2, a resist layer 110 may be formed over the surface of IC 100 (e.g., over hardmask layer 108). As will be appreciated in light of this disclosure, resist layer 110 can be formed from any suitable resist material (or combination of such materials), using any suitable technique (or combination of techniques) as typically done. For example, in some cases, a spin-on deposition (SOD) process may be utilized to distribute a liquid photoresist over IC 100. In some other cases, a laminated dry film photoresist may be deposited over IC 100. As will be appreciated further, after deposition, resist layer 110 can undergo additional processing (e.g., exposure and development), as typically done. Other suitable materials and techniques for forming resist layer 110 will depend on a given application and will be apparent in light of this disclosure.

Furthermore, the dimensions of resist layer 110 can be customized as desired for a given target application or end-use. For example, in some embodiments, resist layer 110 may have a thickness in the range of about 0.3-5.0 µm (e.g., about 0.3-2.5 µm, about 2.5-5.0 µm, or any other sub-range in the range of about 0.3-5.0 µm). In some instances, resist layer 110 may have a substantially uniform thickness over the topography provided, for example, by any underlying layers of IC 100 (e.g., hardmask layer 108). In some instances, resist layer 110 may be provided as a substantially conformal layer over such topography. In some other instances, resist layer 110 may be provided with a non-uniform or otherwise varying thickness over such topography. For example, in some cases a first portion of resist layer 110 may have a thickness within a first range while a second portion thereof has a thickness within a second, different range. Other suitable dimensions for resist layer 110 will depend on a given application and will be apparent in light of this disclosure.

In accordance with some embodiments, resist layer 110 may be processed so as to form one or more openings 110' therein. In accordance with some embodiments, the openings 110' may be formed over a region of IC 100 in which the TBV opening 112 (discussed below) is to be formed. The dimensions of a given opening 110' of resist layer 110 can be customized as desired for a given target application or end-use. A given opening 110' may be provided with a depth, for example, that traverses the entire thickness of resist layer 110, thus exposing the surface of underlying hardmask layer 108, in some cases. Also, as will be appreciated in light of this disclosure, the width of a given opening 110' may determine, at least in part, the width/diameter (W) of the TBV opening 112 (discussed below) that may be formed there under. Other suitable dimensions for the one or more openings 110' will depend on a given application and will be apparent in light of this disclosure.

Figure 3:
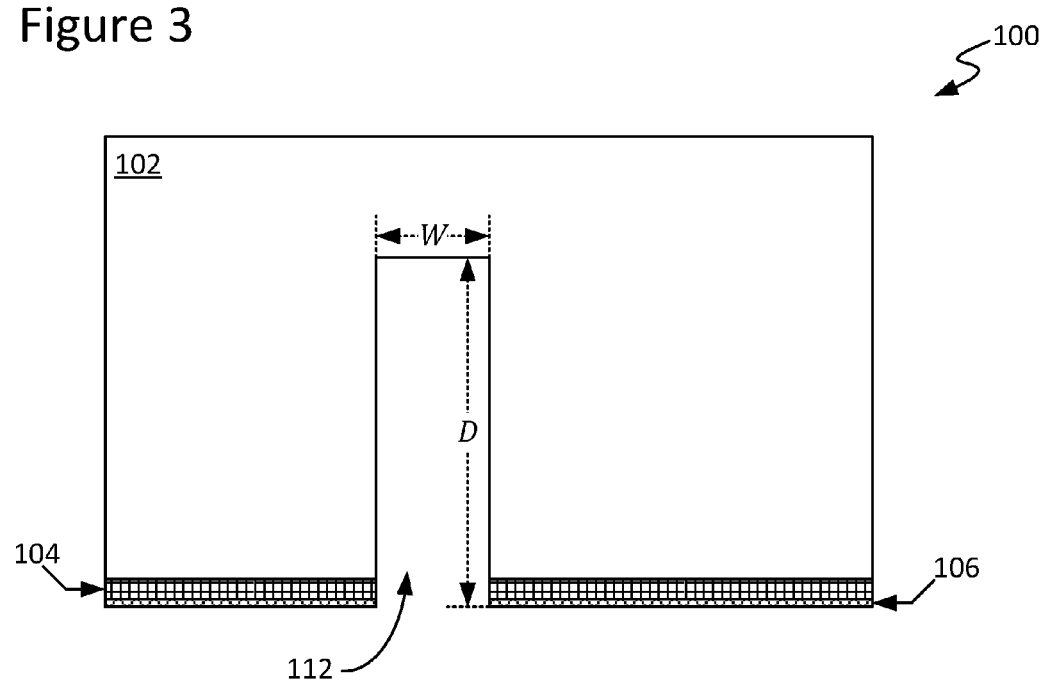
FIG. 3 is a cross-sectional view of the IC of FIG. 2 after forming a TBV opening therein, in accordance with an embodiment of the present disclosure.

The process may continue as in FIG. 3, which is a cross-sectional view of the IC 100 of FIG. 2 after forming a TBV opening 112 therein, in accordance with an embodiment of the present disclosure. TBV opening 112 may be formed in IC 100, in accordance with some embodiments, by utilizing patterned resist layer 110 (e.g., patterned with one or more openings 110') as a mask and etching through hardmask layer 108, polish stop layer 106, and/or the one or more front-end layers 104, and into semiconductor layer 102. To that end, TBV opening 112 may be formed, in accordance with some embodiments, using an anisotropic dry plasma etching process. The etch chemistry can be customized, as desired, and in some instances may be one, for example, that can be utilized in pulsed or time-multiplexed (e.g., Bosch process) etching. Other suitable techniques for forming TBV opening 112 will depend on a given application and will be apparent in light of this disclosure.

As discussed herein, TBV opening 112 may be configured, in accordance with some embodiments, to host, at least in part: (1) a barrier layer 114; (2) an electrically conductive ink 116 to be subsequently cured to provide an electrically conductive seed layer 116; and/or (3) a metal layer 118 (e.g., interconnect 118) of a TBV 101. To that end, the geometry and/or dimensions of TBV opening 112 can be customized as desired for a given target application or end-use, in accordance with some embodiments. For instance, in some cases, TBV opening 112 may have a generally cylindrical geometry that may be generally circular in cross-sectional profile. In some embodiments, TBV opening 112 may have a depth (D), for example, in the range of about 50-100 μm (e.g., about 50-75 μm, about 75-100 μm, or any other sub-range in the range of about 50-100 μm). In some embodiments, TBV opening 112 may have a width (W), for example, in the range of about 6-30 μm (e.g., about 6-18 μm, about 18-30 μm, or any other sub-range in the range of about 6-30 μm). Other suitable geometries and dimensions for TBV opening 112 will depend on a given application and will be apparent in light of this disclosure.

Figure 4:
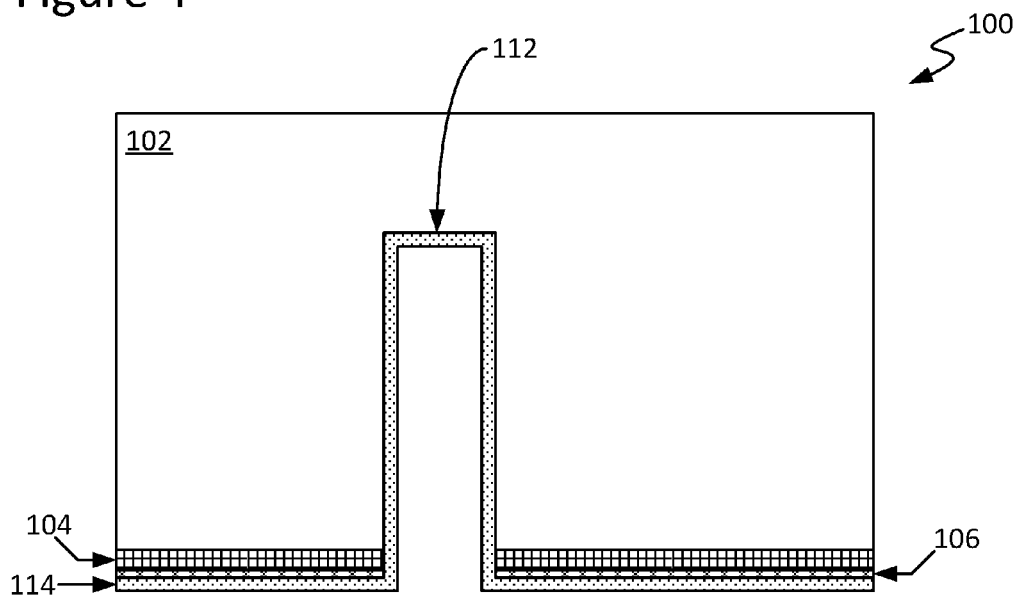
FIG. 4 is a cross-sectional view of the IC of FIG. 3 after removing any remaining patterned resist layer and hardmask layer and after forming a barrier layer, in accordance with an embodiment of the present disclosure.

The process may continue as in FIG. 4, which is a cross-sectional view of the IC 100 of FIG. 3 after removing any remaining patterned resist layer 110 and hardmask layer 108 and after forming a barrier layer 114, in accordance with an embodiment of the present disclosure. As can be seen, any remaining resist layer 110 and hardmask layer 108 can be removed from IC 100. It should be noted, however, that in some cases, the etch time for forming TBV opening 112 may be sufficiently lengthy, for example, such that resist layer 110 may be etched away, in part or in whole, during such etch processing. Also, in some cases, there may be one or more additional cleans, for example, to remove any etch polymer that may have formed during the etch processing of insulator layer 102 to form TBV opening 112. Other suitable techniques for removing the remainder, if any, of resist layer 110 and/or hardmask layer 108 will depend on a given application and will be apparent in light of this disclosure.

As can be seen from FIG. 4, a barrier layer 114 may be formed over the surface of IC 100 (e.g., over the topography provided by polish stop layer 106, the one or more front-end layers 104, and/or a given TBV opening 112 formed within semiconductor layer 102). In accordance with some embodiments, barrier layer 114 may be configured to help prevent or otherwise reduce diffusion of the constituent material(s) of interconnect 118 (discussed below) into surrounding layers. To that end, barrier layer 114 can be formed from any suitable insulator material (or combination of such materials), using any of a wide range of techniques. For example, in some cases, barrier layer 114 may be formed from an insulating polymer, such as: polyimide; parylene; benzocyclobutene (BCB); polypropylene carbonate (PPC); and/or a combination of any one or more thereof. In some cases in which barrier layer 114 includes polyimide and/or parylene, for example, layer 114 may be formed using a chemical vapor deposition (CVD) process, such as plasma-enhanced CVD (PECVD), or other suitable vapor-phase deposition technique. In some cases in which barrier layer 114 includes BCB and/or PPC, for example, layer 114 may be formed using a spin coating process or other suitable spin-on deposition (SOD) technique. In some instances, a combination of vapor-phase and spin-on deposition techniques may be employed in forming barrier layer 114. Other suitable materials and techniques for forming barrier layer 114 will depend on a given application and will be apparent in light of this disclosure.

Furthermore, the dimensions of barrier layer 114 can be customized as desired for a given target application or end-use. For example, in some cases, a sufficient amount of barrier layer 114 may be deposited over IC 100 so as to ensure that, after patterning (discussed below), a portion of barrier layer 114 within TBV opening 112 has a sidewall thickness in the range of about 100-400 nm (e.g., about 100-200 nm, about 200-300 nm, about 300-400 nm, or any other sub-range in the range of about 100-400 nm). In some embodiments, barrier layer 114 may be formed over IC 100, at least in part, so as to line the bottom and sidewalls of a given TBV opening 112. In some instances, barrier layer 114 may have a substantially uniform thickness over the topography provided, for example, by any underlying layers of IC 100 (e.g., polish stop layer 106, the one or more front-end layers 104, and/or a given TBV opening 112 of semiconductor layer 102). In some instances, barrier layer 114 may be provided as a substantially conformal layer over such topography. In some other instances, barrier layer 114 may be provided with a non-uniform or otherwise varying thickness over such topography. For example, in some cases a first portion of barrier layer 114 may have a thickness within a first range while a second portion thereof has a thickness within a second, different range. Other suitable dimensions for barrier layer 114 will depend on a given application and will be apparent in light of this disclosure.

Figure 5:
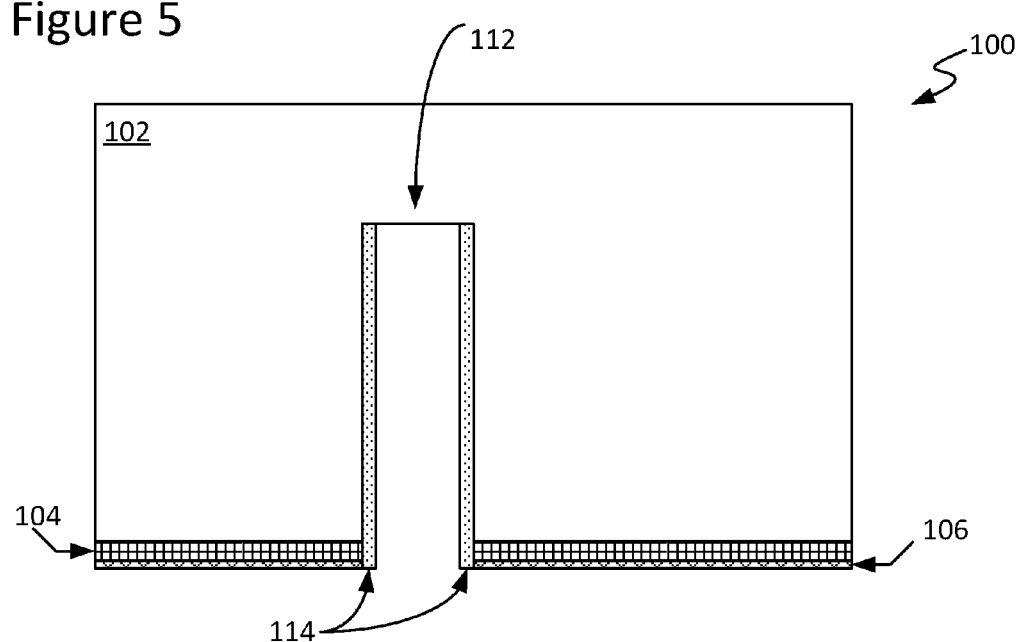
FIG. 5 is a cross-sectional view of the IC of FIG. 4 after patterning the barrier layer, in accordance with an embodiment of the present disclosure.

The process may continue as in FIG. 5, which is a cross-sectional view of the IC 100 of FIG. 4 after patterning barrier layer 114, in accordance with an embodiment of the present disclosure. In accordance with some embodiments, barrier layer 114 may be processed so as to remove portions thereof that are: (1) located over the floor of TBV opening 112; and/or (2) located over polish stop layer 106 (e.g., within field areas between neighboring TBVs 101 of IC 100, if optionally provided). To that end, barrier layer 114 can be patterned using any suitable standard and/or custom patterning process, as will be apparent in light of this disclosure. In accordance with some embodiments, a dry plasma-based etch process may be utilized in anisotropically etching barrier layer 114. Also, the etch chemistry can be customized, as desired, and in some instances may utilize an oxygen ($O_2$)-based plasma. After patterning, at least a portion of barrier layer 114 may remain within TBV opening 112 over the sidewall(s) thereof, as generally depicted in FIG. 5. Other suitable techniques for patterning barrier layer 114 will depend on a given application and will be apparent in light of this disclosure.

Figure 6:
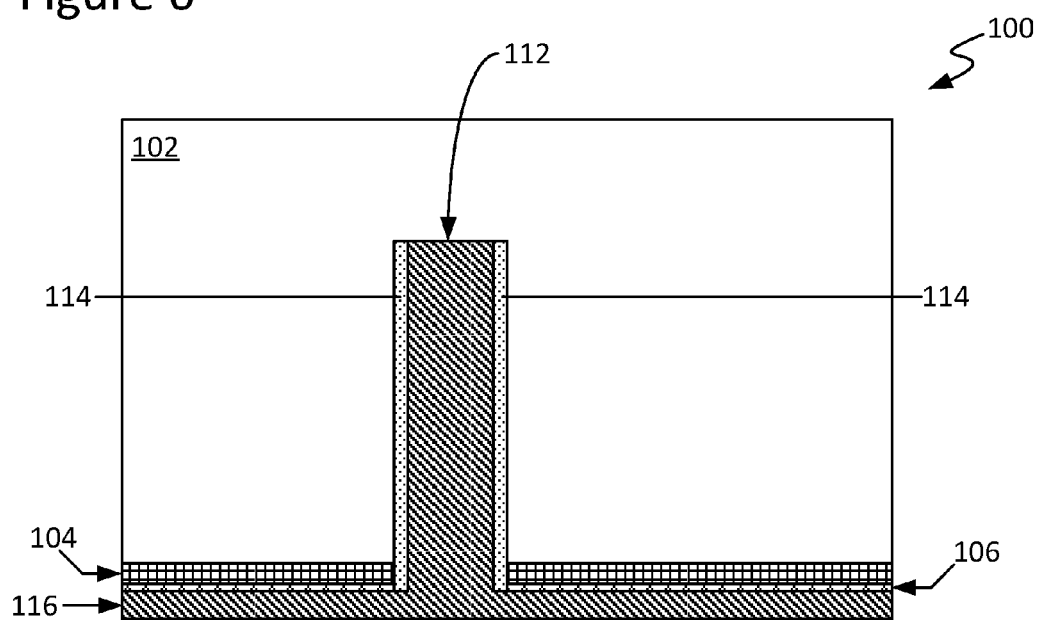
FIG. 6 is a cross-sectional view of the IC of FIG. 5 after applying an electrically conductive ink, in accordance with an embodiment of the present disclosure.

The process may continue as in FIG. 6, which is a cross-sectional view of the IC 100 of FIG. 5 after applying an electrically conductive ink 116, in accordance with an embodiment of the present disclosure. As can be seen here, the surface of IC 100 (e.g., the topography provided by polish stop layer 106, barrier layer 114, and/or a given TBV opening 112 within semiconductor layer 102) can be coated with an electrically conductive ink 116. In accordance with some embodiments, ink layer 116 may be a metal-based conductive ink containing copper (Cu), silver (Ag), and/or a combination of any one or more thereof. It should be noted, however, that the present disclosure is not so limited to only to these example materials, as in a more general sense, and in accordance with some other embodiments, the material(s)

selected for ink layer 116 may be made to match material(s) is utilized in metal layer 118, discussed below. Also, the conductive ink material of layer 116 may be a nanoparticle-based formulation and/or a metal complex-based formulation, as desired for a given target application or end-use. In accordance with some embodiments, the conductive ink material may be applied directly onto barrier layer 114. To that end, electrically conductive ink layer 116 may be formed, for example, using: a spin-on deposition (SOD) process, such as spin coating; a physical vapor deposition (PVD) process; a chemical vapor deposition (CVD) process; and/or a combination of any one or more thereof. Other suitable materials and techniques for forming electrically conductive ink layer 116 will depend on a given application and will be apparent in light of this disclosure.

Figure 7:
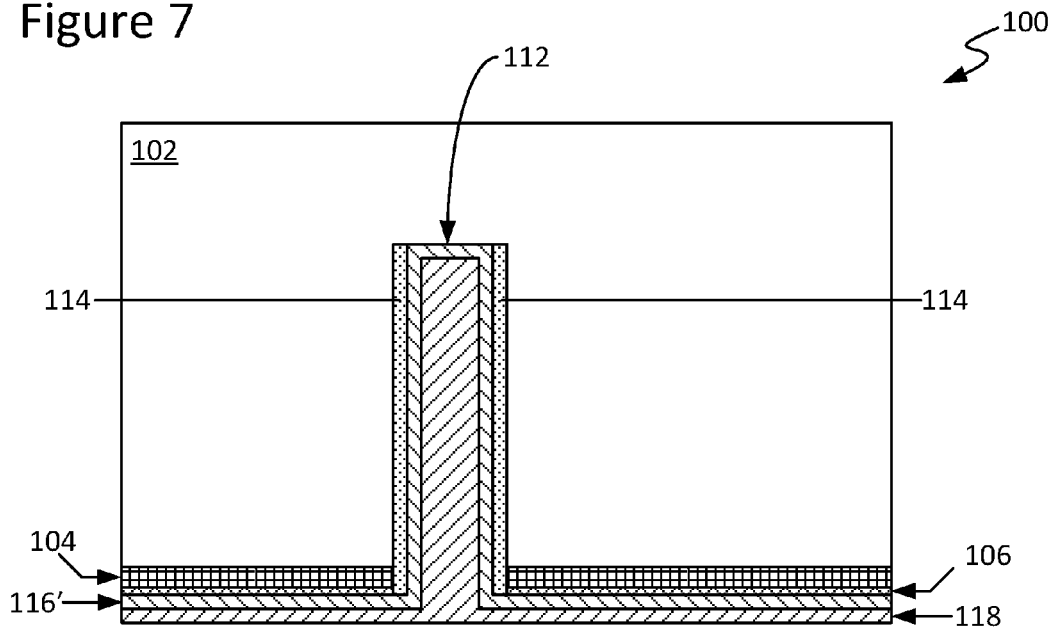
FIG. 7 is a cross-sectional view of the IC of FIG. 6 after curing the ink layer to form an electrically conductive seed layer and forming a metal layer, in accordance with an embodiment of the present disclosure.

The process may continue as in FIG. 7, which is a cross-sectional view of the IC 100 of FIG. 6 after curing ink layer 116 to form an electrically conductive seed layer 116' and forming a metal layer 118, in accordance with an embodiment of the present disclosure. After deposition, electrically conductive ink layer 116 may undergo a curing process. In accordance with some embodiments, ink layer 116 may be cured over IC 100 in an ambient environment of nitrogen ($N_2$). In some cases, curing may be performed at a temperature, for example, in the range of about 100-200° C. (e.g., about 100-125° C., about 125-150° C., about 150-175° C., about 175-200° C., or any other sub-range in the range of about 100-200° C.). In a more general sense, the process conditions for curing ink layer 116 may be customized, as desired for a given target application or end-use. After curing ink layer 116, the resultant seed layer 116' may be an electrically conductive metal film that can be used, in accordance with some embodiments, as a seed layer for deposition of metal layer 118 (discussed below) within TBV opening 112.

Furthermore, the dimensions of electrically conductive seed layer 116' can be customized as desired for a given target application or end-use. For example, in some cases, a sufficient amount of ink layer 116 may be deposited over IC 100 so as to ensure that, after curing, the resultant seed layer 116' has a thickness in the range of about 50-150 nm (e.g., about 75-125 nm, or any other sub-range in the range of about 50-150 nm). In some instances, seed layer 116' may have a substantially uniform thickness over the topography provided, for example, by any underlying layers of IC 100 (e.g., polish stop layer 106, barrier layer 114, and/or a given TBV opening 112 of semiconductor layer 102). In some instances, seed layer 116' may be substantially conformal to such topography. In some other instances, seed layer 116' may have a non-uniform or otherwise varying thickness over such topography. For example, in some cases a first portion of seed layer 116' may have a thickness within a first range while a second portion thereof has a thickness within a second, different range. Other suitable dimensions for electrically conductive seed layer 116' (and/or its precursor ink layer 116) will depend on a given application and will be apparent in light of this disclosure.

As can be seen further from FIG. 7, a metal layer 118 may be formed over the surface of IC 100 (e.g., over electrically conductive seed layer 116'). As will be appreciated in light of this disclosure, metal layer 118 can be formed from any suitable electrically conductive metal (or combination of such materials), using any of a wide range of techniques as typically done. In some example cases, metal layer 118 may be formed from copper (Cu), nickel (Ni), cobalt (Co), and/or a combination of any one or more thereof. In some example cases, metal layer 118 may be formed using an electroplating process. Other suitable materials and techniques for forming metal layer 118 will depend on a given application and will be apparent in light of this disclosure.

Also, as discussed below with reference to FIG. 8, the dimensions of metal layer 118 can be customized as desired for a given target application or end-use. For example, in some cases, a sufficient amount of metal layer 118 may be deposited over IC 100 so as to ensure that it fills at least a portion of a given TBV opening 112 (e.g., a remaining portion thereof after formation of barrier layer 114 and electrically conductive seed layer 116' therein). In some other instances, metal layer 118 may be provided with a non-uniform or otherwise varying thickness over the topography provided, for example, by any underlying layers of IC 100 (e.g., electrically conductive seed layer 116'). For example, in some cases a first portion of metal layer 118 may have a thickness within a first range while a second portion thereof has a thickness within a second, different range. In some cases, metal layer 118 may fill completely the remainder of TBV opening 112 (e.g., after curing ink layer 116 to form seed layer 116' and forming barrier layer 114 therein). Other suitable dimensions for metal layer 118 will depend on a given application and will be apparent in light of this disclosure.

Figure 8:
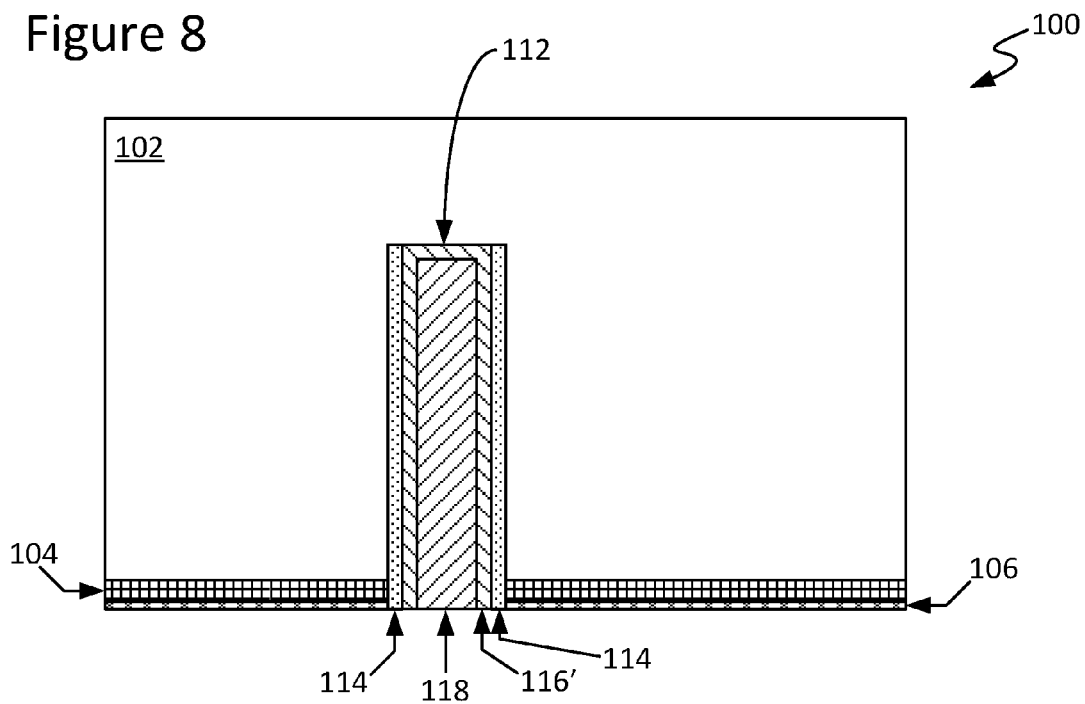
FIG. 8 is a cross-sectional view of the IC of FIG. 7 after planarization, in accordance with an embodiment of the present disclosure.

The process may continue as in FIG. 8, which is a cross-sectional view of the IC 100 of FIG. 7 after planarization, in accordance with an embodiment of the present disclosure. As will be appreciated in light of this disclosure, it may be desirable in some instances to planarize IC 100, for example, to remove any undesired excess (e.g., overburden) of: (1) metal layer 118; and/or (2) electrically conductive seed layer 116'. To that end, IC 100 may undergo, for example: a chemical-mechanical planarization (CMP) process; an etch-and-clean process; and/or any other suitable planarization/polish process, as will be apparent in light of this disclosure. In some cases, the selected planarization process may be selective, for example, to polish stop layer 106 such that layer 106 remains substantially unaffected after the planarization process is completed. Other suitable techniques for planarizing IC 100 will depend on a given application and will be apparent in light of this disclosure.

After planarization, a portion of metal layer 118 may remain within TBV opening 112. In accordance with some embodiments, this remainder of metal layer 118 may be utilized, for example, as a via-type interconnect (e.g., hereinafter interconnect 118) of TBV 101. As will be appreciated in light of this disclosure, the geometry and/or dimensions of interconnect 118 may depend, at least in part, on the geometry and/or dimensions of its associated TBV opening 112 and any additional layers therein (e.g., barrier layer 114; electrically conductive seed layer 116'). Thus, in some cases, interconnect 118 may have a length in the range of about 50-100 μm (e.g., about 50-75 μm, about 75-100 μm, or any other sub-range in the range of about 50-100 μm). In some cases in which TBV opening 112 has a generally cylindrical geometry of generally circular cross-sectional profile, for example, interconnect 118 may be substantially similar in geometry and profile. Other suitable geometries and dimensions for interconnect 118 will depend on a given application and will be apparent in light of this disclosure.

Figure 9:
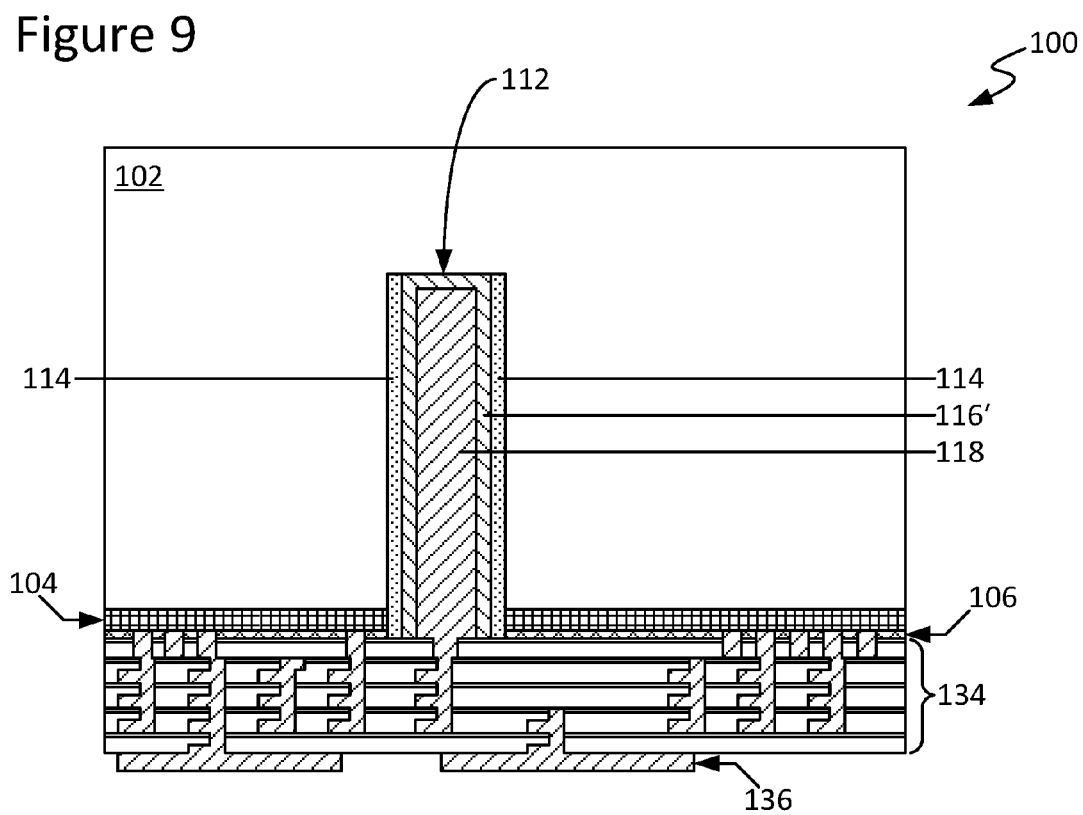
FIG. 9 is a cross-sectional view of the IC of FIG. 8 after formation of one or more back-end layers and a metal bump layer, in accordance with an embodiment of the present disclosure.

The process may continue as in FIG. 9, which is a cross-sectional view of the IC 100 of FIG. 8 after formation of one or more back-end layers 134 and a metal bump layer 136, in accordance with an embodiment of the present disclosure. As can be seen, IC 100 may include one or more back-end layers 134 formed there over. In some instances, a given back-end layer 134 may include one or more far-backend layers. In some embodiments, back-end layer(s) 134 may be formed, at least in part, over polish stop layer 106. However, the present disclosure is not so limited, as in some other embodiments, it may be desirable to remove polish stop layer 106, in part or in whole, prior to forming the one or more back-end layers 134 over IC 100. Numerous configurations will be apparent in light of this disclosure. In accordance with some embodiments, back-end layer(s) 134 may include: (1) one or more back-end wiring layers; (2) one or more far-back-end passivation layers; and/or (3) one or more metal redistribution layers (RDLs). In some instances, back-end layer(s) 134 may include one or more de-coupling capacitors. In some instances, back-end layer(s) 134 may include one or more random-access memory devices, such as embedded dynamic random-access memory (eDRAM) and/or spin-transfer torque random-access memory (STT-RAM). In some cases, the one or more back-end layers 134 may provide structure upon which an additional layer and/or component can be populated. Other suitable layers and/or devices which can be included in the one or more back-end layers 134 of IC 100 will depend on a given application and will be apparent in light of this disclosure.

As can be seen further from FIG. 9, IC 100 may include a metal bump layer 136 formed there over (e.g., over the one or more back-end layers 134). Metal bump layer 136 can be formed using any suitable electrically conductive metal (or combination of such materials), as typically done. For example, in some cases, metal bump layer 136 may be formed from: a lead-tin (Pb—Sn) solder; a tin-silver (Sn—Ag) solder; a tin-copper (Sn—Cu) solder; gold (Au); copper (Cu); and/or a combination of any one or more thereof. Also, metal bump layer 136 can be formed over IC 100 using any suitable technique, as typically done. Furthermore, the dimensions of metal bump layer 136 can be customized as desired for a given target application or end-use. Other suitable materials, dimensions, and techniques for forming metal bump layer 136 will depend on a given application and will be apparent in light of this disclosure.

Figure 10:
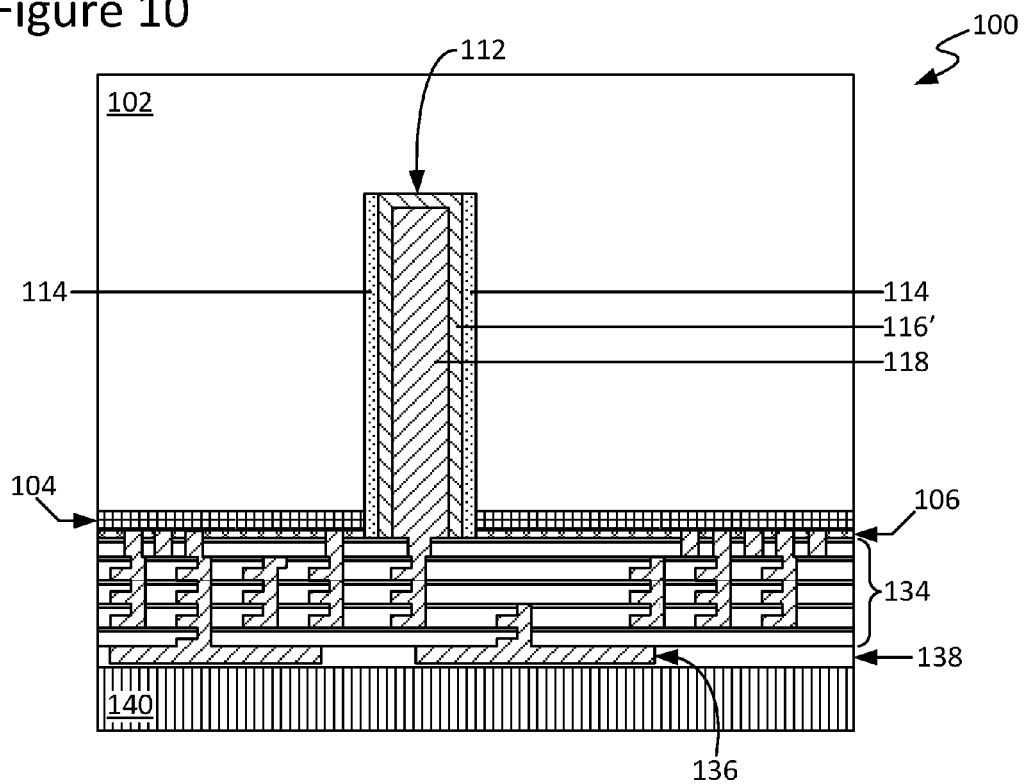
FIG. 10 is a cross-sectional view of the IC of FIG. 9 after depositing an adhesive layer and bonding with a carrier substrate, in accordance with an embodiment of the present disclosure.

The process may continue as in FIG. 10, which is a cross-sectional view of the IC 100 of FIG. 9 after depositing an adhesive layer 138 and bonding with a carrier substrate 140, in accordance with an embodiment of the present disclosure. As can be seen, an adhesive layer 138 can be deposited over the surface of IC 100 (e.g., over metal bump layer 136 and one or more back-end layers 134). Adhesive layer 138 can be formed from any suitable adhesive bonding material (or combination of such materials), as typically done. For instance, adhesive layer 138 can be formed from a solvent-release glue, a laser-release glue, and/or a thermal-release glue, in accordance with some embodiments. Also, as will be appreciated in light of this disclosure, adhesive layer 138 can be formed over IC 100 using any suitable technique, as typically done. Furthermore, the amount of adhesive material used for adhesive layer 138 can be customized as desired for a given target application or end-use. Other suitable materials, quantities, and techniques for forming adhesive layer 138 will depend on a given application and will be apparent in light of this disclosure.

In accordance with some embodiments, carrier substrate 140 can be bonded with the surface of IC 100 in a temporary manner or as otherwise desired. The material composition and configuration of carrier substrate 140 can be customized as desired for a given target application or end-use. In some cases, carrier substrate 140 may be, for example, a bare silicon wafer or a glass wafer. In some cases, if adhesive layer 138 includes a solvent-release glue, then carrier substrate 140 may include perforations, for example, to assist with application of a solvent for purposes of de-bonding carrier substrate 140 from IC 100. In some cases, if adhesive layer 138 includes a laser-release glue, then carrier substrate 140 may be transparent, for example, to assist with application of laser light for purposes of de-bonding carrier substrate 140 from IC 100. Also, the dimensions of carrier substrate 140 can be customized as desired for a given target application or end-use. Other suitable materials, configurations, and dimensions for carrier substrate 140 will depend on a given application and will be apparent in light of this disclosure.

Figure 11:
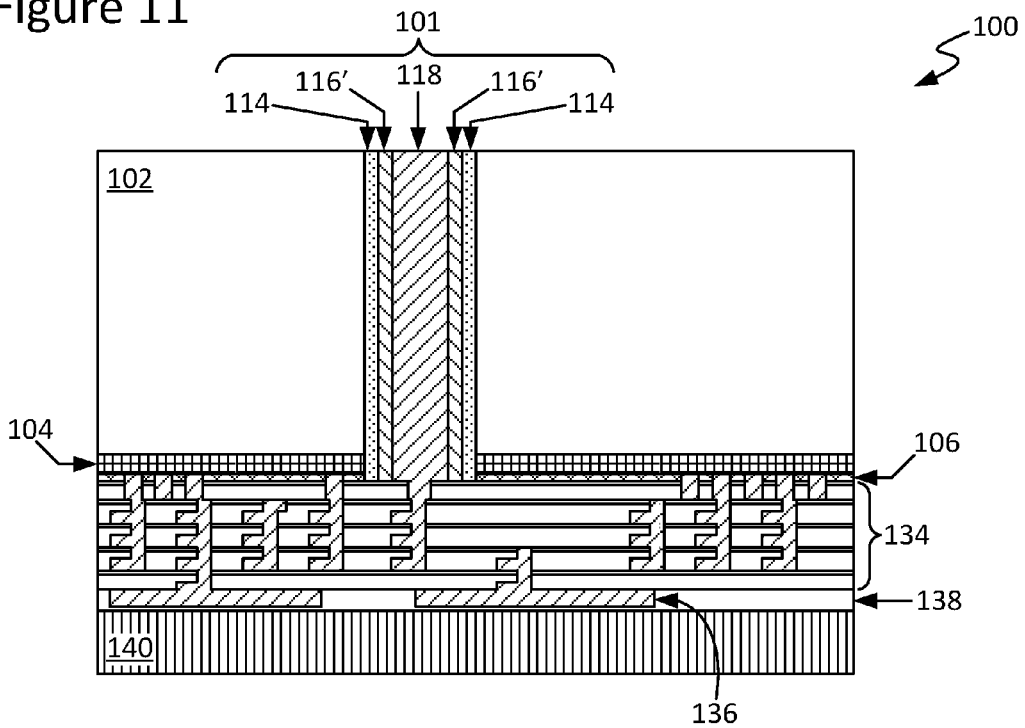
FIG. 11 is a cross-sectional view of the IC of FIG. 10 after thinning thereof, in accordance with an embodiment of the present disclosure.

The process may continue as in FIG. 11, which is a cross-sectional view of the IC 100 of FIG. 10 after thinning thereof, in accordance with an embodiment of the present disclosure. IC 100 can undergo thinning, in accordance with some embodiments, to remove any undesired portion of: (1) semiconductor layer 102; (2) barrier layer 114; and/or (3) seed layer 116'. To that end, IC 100 may undergo, for example: a grinding process; a chemical-mechanical planarization (CMP) process; an etch-and-clean process (e.g., using plasma etching and/or bulk silicon etchants); and/or any other suitable planarization/polish process, as will be apparent in light of this disclosure. In some cases, after thinning, the interconnect 118 of TBV 101 may be exposed at the surface of IC 100, revealing the exposed end of TBV 101 for additional processing, if desired. Also, after thinning, IC 100 may undergo one or more cleaning processes, for example, to remove any copper (Cu) or other conductive metal (from which interconnect 118 may be made) from the surface of semiconductor layer 102. In accordance with some embodiments, this can help to prevent or otherwise reduce diffusion of the metal through semiconductor layer 102 and into the one or more front-end layers 104. In some instances, this may help to minimize or otherwise reduce transistor device performance degradation. Other suitable techniques for thinning IC 100 will depend on a given application and will be apparent in light of this disclosure.

Figure 12:
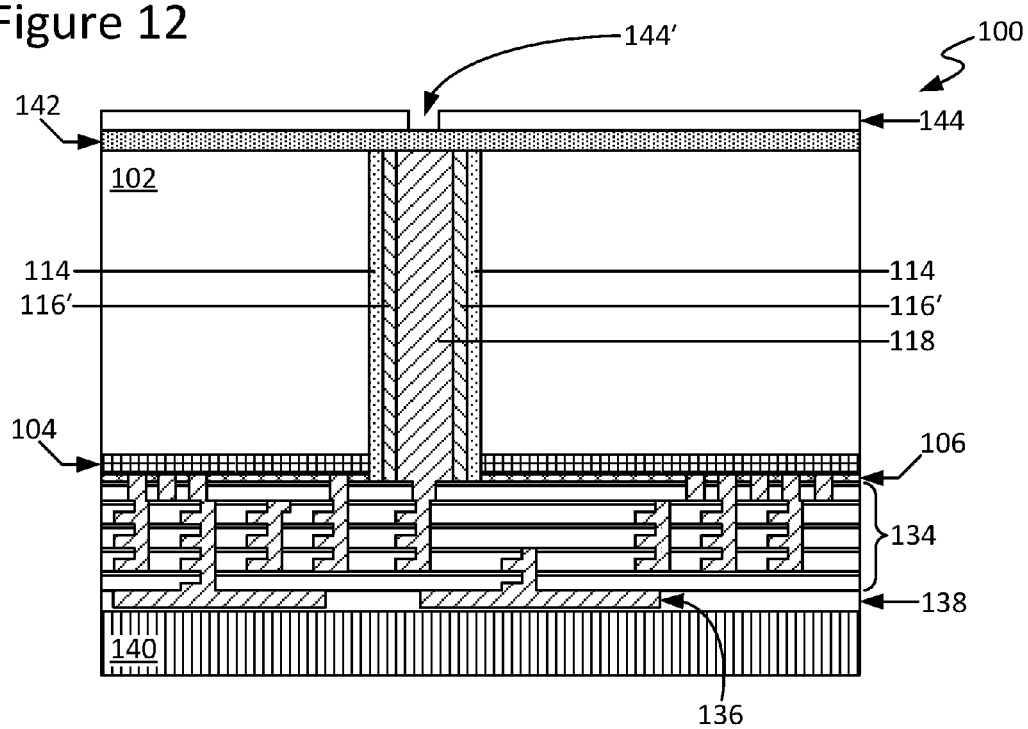
FIG. 12 is a cross-sectional view of the IC of FIG. 11 after forming a dielectric layer and a resist layer, in accordance with an embodiment of the present disclosure.

The process may continue as in FIG. 12, which is a cross-sectional view of the IC 100 of FIG. 11 after forming a dielectric layer 142 and a resist layer 144, in accordance with an embodiment of the present disclosure. As can be seen, a dielectric layer 142 may be formed over the surface of IC 100 (e.g., over the topography provided by semiconductor layer 102, barrier layer 114, seed layer 116', and/or interconnect 118). Dielectric layer 142 can be formed from any of a wide range of suitable dielectric materials. For example, in some cases, dielectric layer 142 may be formed from: silicon nitride ($Si_3N_4$); silicon carbide (SiC); silicon dioxide ($SiO_2$); and/or a combination of any one or more thereof. In some cases, dielectric layer 142 may serve, at least in part, as a passivation layer which provides a hermetic barrier that protects underlying semiconductor layer 102 from trace metal and/or moisture contamination, in accordance with some embodiments. Also, dielectric layer 142 can be formed over IC 100 using any suitable technique, and in some cases may be formed, for example, using a chemical vapor deposition (CVD) process, such as a plasma-enhanced CVD (PECVD) process. Other suitable materials and techniques for forming dielectric layer 142 will depend on a given application and will be apparent in light of this disclosure.

Furthermore, the dimensions of dielectric layer 142 can be customized as desired for a given target application or end-use. For example, in some embodiments, dielectric layer 142 may have a thickness in the range of about 0.5-2.0 μm (e.g., about 0.5-1.25 μm, about 1.25-2.0 μm, or any other sub-range in the range of about 0.5-2.0 μm). In some instances, dielectric layer 142 may have a substantially uniform thickness over the topography provided, for example, by any underlying layers of IC 100 (e.g., semiconductor layer 102, barrier layer 114, seed layer 116', and/or interconnect 118). In some instances, dielectric layer 142 may be provided as a substantially conformal layer over such topography. In some other instances, dielectric layer 142 may be provided with a non-uniform or otherwise varying thickness over such topography. For example, in some cases a first portion of dielectric layer 142 may have a thickness within a first range while a second portion thereof has a thickness within a second, different range. Other suitable dimensions for dielectric layer 142 will depend on a given application and will be apparent in light of this disclosure.

As can be seen, a resist layer 144 may be formed over the surface of IC 100 (e.g., over dielectric layer 142). As will be appreciated in light of this disclosure, resist layer 144 can be formed from any of the example resist materials discussed above, for instance, with reference to resist layer 110, in accordance with some embodiments. As will be appreciated further, resist layer 144 can be formed (e.g., deposited, exposed, and/or developed) using any of the example techniques discussed above, for instance, with reference to resist layer 110, in accordance with some embodiments. Other suitable materials and techniques for forming resist layer 144 will depend on a given application and will be apparent in light of this disclosure.

Also, the dimensions of resist layer 144 can be customized as desired for a given target application or end-use. For example, in some embodiments, resist layer 144 may have a thickness in the range of about 0.3-5.0 µm (e.g., about 0.3-2.5 µm, about 2.5-5.0 µm, or any other sub-range in the range of about 0.3-5.0 µm). In some instances, resist layer 144 may have a substantially uniform thickness over the topography provided, for example, by any underlying layers of IC 100 (e.g., dielectric layer 142). In some instances, resist layer 144 may be provided as a substantially conformal layer over such topography. In some other instances, resist layer 144 may be provided with a non-uniform or otherwise varying thickness over such topography. For example, in some cases a first portion of resist layer 144 may have a thickness within a first range while a second portion thereof has a thickness within a second, different range. Other suitable dimensions for resist layer 144 will depend on a given application and will be apparent in light of this disclosure.

In accordance with some embodiments, resist layer 144 may be processed so as to form one or more openings 144' therein. In accordance with some embodiments, a given opening 144' may be formed in resist layer 144 at a location over interconnect 118 of TBV 101. The dimensions of a given opening 144' of resist layer 144 can be customized as desired for a given target application or end-use. A given opening 144' may be provided with a depth, for example, that traverses the entire thickness of resist layer 144, thus exposing the surface of underlying dielectric layer 142, in some cases. Also, as will be appreciated in light of this disclosure, the width of a given opening 144' may determine, at least in part, the dimensions of a corresponding opening 142' (discussed below) which may be formed within dielectric layer 142. Other suitable dimensions for the one or more openings 144' will depend on a given application and will be apparent in light of this disclosure.

Figure 13:
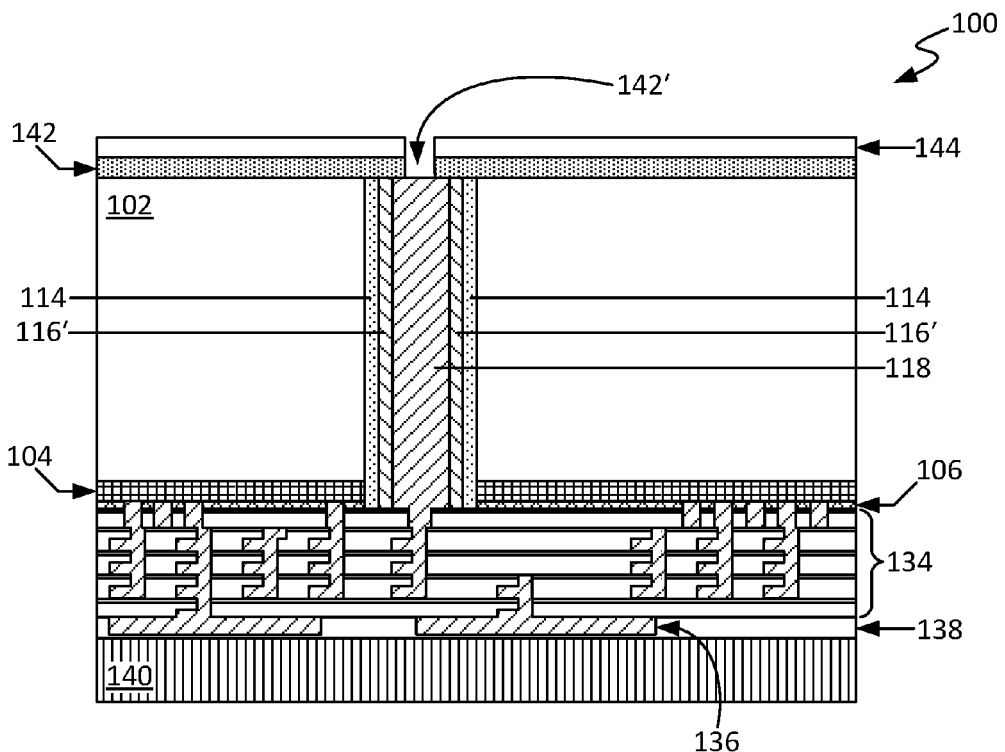
FIG. 13 is a cross-sectional view of the IC of FIG. 12 after patterning the dielectric layer, in accordance with an embodiment of the present disclosure.

The process may continue as in FIG. 13, which is a cross-sectional view of the IC 100 of FIG. 12 after patterning dielectric layer 142, in accordance with an embodiment of the present disclosure. As can be seen, one or more openings 142' may be formed in dielectric layer 142. In accordance with some embodiments, dielectric layer 142 can be processed such that an opening 142' is formed over interconnect 118 of TBV 101. As discussed herein, by virtue of such a configuration, the openings 142' may allow for electrical terminal connections to interconnect 118, in accordance with some embodiments. Also, as will be appreciated in light of this disclosure, the dimensions (e.g., width) of a given opening 142' can be customized as desired for a given target application or end-use and may depend, at least in part, on the dimensions (e.g., width) of an opening 144' of resist layer 144 associated therewith.

Opening(s) 142' may be formed, in accordance with some embodiments, by utilizing patterned resist layer 144 (e.g., patterned with one or more openings 144') as a mask and etching through dielectric layer 142. To that end, opening(s) 142' may be formed, in accordance with some embodiments, using an anisotropic dry plasma etching process and/or a wet etching process. The etch chemistry can be customized, as desired, and in some instances may be one, for example, that can be utilized in pulsed or time-multiplexed (e.g., Bosch process) etching. In some cases in which dielectric layer 142 includes silicon nitride ($Si_3N_4$), for example, a wet etch chemistry utilizing hydrofluoric (HF) acid or buffered HF (e.g., $NH_4F/HF$) acid, or hot phosphoric ($H_3PO_4$) acid may be used to etch opening(s) 142'. In some instances it may be desirable to stop etching dielectric layer 142, for example, when underlying interconnect 118 is reached. Other suitable techniques for forming a given opening 142' in dielectric layer 142 will depend on a given application and will be apparent in light of this disclosure.

Figure 14:
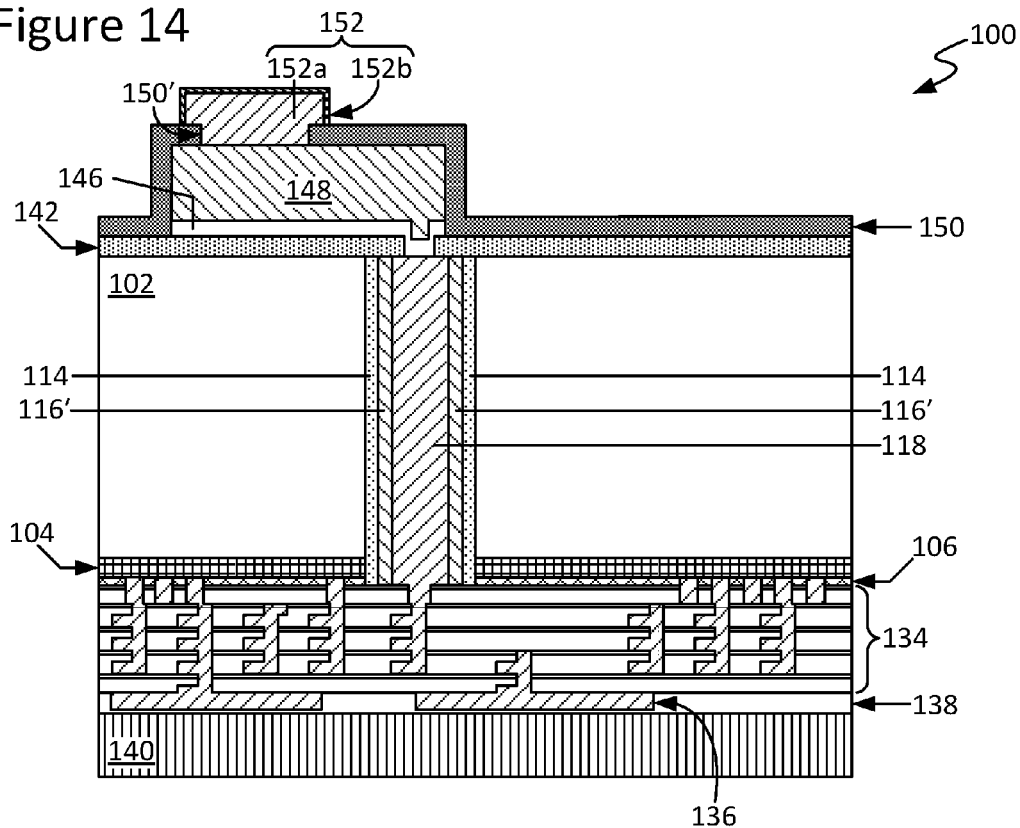
FIG. 14 is a cross-sectional view of the IC of FIG. 13 after removing any remaining patterned resist layer and forming a barrier/adhesion layer, one or more redistribution layers (RDLs), a dielectric layer, and a surface finish layer, in accordance with an embodiment of the present disclosure.

The process may continue as in FIG. 14, which is a cross-sectional view of the IC 100 of FIG. 13 after removing any remaining patterned resist layer 144 and forming a barrier/adhesion layer 146, one or more redistribution layers (RDLs) 148, a dielectric layer 150, and a surface finish layer 152, in accordance with an embodiment of the present disclosure. As can be seen, any remaining resist layer 144 can be removed from IC 100. Also, in some cases, there may be one or more additional cleans, for example, to remove any remaining etch polymer and/or residue from the surface of IC 100. Other suitable techniques for removing the remainder, if any, of resist layer 144 will depend on a given application and will be apparent in light of this disclosure.

As can be seen, a barrier/adhesion layer 146 may be formed over the surface of IC 100 (e.g., over patterned dielectric layer 142). Barrier/adhesion layer 146 can be formed from any suitable barrier/adhesion material (or combination of such materials). For example, in some cases, barrier/adhesion layer 146 may be formed from: titanium (Ti); tantalum (Ta); titanium nitride (TiN); tantalum nitride (TaN); a titanium-tungsten (Ti—W) alloy; and/or a combination of any one or more thereof. Also, barrier/adhesion layer 146 can be formed over IC 100 using any suitable technique, and in accordance with some embodiments, may be formed using a physical vapor deposition (PVD) process. Other suitable materials and techniques for forming barrier/adhesion layer 146 will depend on a given application and will be apparent in light of this disclosure.

Furthermore, the dimensions of barrier/adhesion layer 146 can be customized as desired for a given target application or end-use. For example, in some embodiments, barrier/adhesion layer 146 may have a thickness in the range of about 250-1,000 Å (e.g., about 250-500 Å, about 500-750 Å, about 750-1,000 Å, or any other sub-range in the range of about 250-1,000 Å). In some instances, barrier/adhesion layer 146 may have a substantially uniform thickness over the topography provided, for example, by any underlying layers of IC 100 (e.g., patterned dielectric layer 142). In some instances, barrier/adhesion layer 146 may be provided as a substantially conformal layer over such topography. In some other instances, barrier/adhesion layer 146 may be provided with a non-uniform or otherwise varying thickness over such topography. For example, in some cases a first portion of barrier/adhesion layer 146 may have a thickness within a first range while a second portion thereof has a thickness within a second, different range. Other suitable dimensions for barrier/adhesion layer 146 will depend on a given application and will be apparent in light of this disclosure.

Also, as can be seen from FIG. 14, one or more redistribution layers (RDLs) 148 may be formed over the surface of IC 100 (e.g., over barrier/adhesion layer 146). RDL 148 can be formed from any suitable electrically conductive metal (or combination of such materials). For example, in some cases, RDL 148 may be formed from: copper (Cu); aluminum (Al); and/or a combination of any one or more thereof. Also, RDL 148 can be formed over IC 100 using any suitable technique, as typically done. For example, in accordance with some embodiments, RDL 148 may be formed using a plate-through resist and/or semi-additive process flow. Other suitable materials and techniques for forming a given RDL 148 will depend on a given application and will be apparent in light of this disclosure.

Furthermore, the dimensions of a given RDL 148 can be customized as desired for a given target application or end-use. For example, in some embodiments, the one or more RDLs 148 may have a height in the range of about 1.0-10.0 µm (e.g., about 1.0-5.0 µm, about 5.0-10.0 µm, or any other sub-range in the range of about 1.0-10.0 µm). In some cases, a given RDL 148 may include a via-type or other interconnect structure extending therefrom which resides over a given opening 142' formed in dielectric layer 142. Other suitable dimensions for the one or more RDLs 148 will depend on a given application and will be apparent in light of this disclosure.

As can be seen further from FIG. 14, a dielectric layer 150 may be formed over the surface of IC 100 (e.g., over the one or more RDLs 148 and/or dielectric layer 142). In accordance with some embodiments, dielectric layer 150 may serve, at least in part, as a passivation layer (e.g., a far-back-end passivation layer), which provides a hermetic barrier that protects the one or more underlying RDLs 148. To that end, dielectric layer 150 can be formed from any suitable dielectric material (or combination of such materials), using any of a wide range of techniques. For example, in some cases, dielectric layer 150 may be formed from: silicon nitride ($Si_3N_4$); silicon carbide (SiC); and/or a combination of any one or more thereof. In some cases, dielectric layer 150 may be configured to serve as dielectric layer for a logic/memory interface or for a bump structure that connects the backside of an active die to another (e.g., upper) die. In accordance with some embodiments, dielectric layer 150 may be formed using a chemical vapor deposition (CVD) process, such as plasma-enhanced CVD (PECVD). Other suitable materials and techniques for forming dielectric layer 150 will depend on a given application and will be apparent in light of this disclosure.

Furthermore, the dimensions of dielectric layer 150 can be customized as desired for a given target application or end-use. For example, in some embodiments, dielectric layer 150 may have a thickness in the range of about 0.5-2.0 µm (e.g., about 0.5-1.25 µm, about 1.25-2.0 µm, or any other sub-range in the range of about 0.5-2.0 µm). In some instances, dielectric layer 150 may have a substantially uniform thickness over the topography provided, for example, by any underlying layers of IC 100 (e.g., RDL 148 and/or dielectric layer 142). In some instances, dielectric layer 150 may be provided as a substantially conformal layer over such topography. In some other instances, dielectric layer 150 may be provided with a non-uniform or otherwise varying thickness over such topography. For example, in some cases a first portion of dielectric layer 150 may have a thickness within a first range while a second portion thereof has a thickness within a second, different range. Other suitable dimensions for dielectric layer 150 will depend on a given application and will be apparent in light of this disclosure.

In accordance with some embodiments, dielectric layer 150 may be patterned with one or more openings 150' (e.g., landing pad openings) therein. In accordance with some embodiments, an opening 150' may be formed in dielectric layer 150 at a location over RDL 148 associated with interconnect 118 of TBV 101. The dimensions of a given opening 150' of dielectric layer 150 can be customized as desired for a given target application or end-use. A given opening 150' may be provided with a depth, for example, that traverses the entire thickness of dielectric layer 150, thus exposing the surface of an underlying RDL 148, in some cases. Other suitable dimensions for the one or more openings 150' will depend on a given application and will be apparent in light of this disclosure.

In addition, as can be seen from FIG. 14, a surface finish layer 152 may be formed over the surface of IC 100 (e.g., within a given opening 150' over a RDL 148 and/or over a portion of dielectric layer 150). In accordance with some embodiments, surface finish layer 152 may be solder-compatible and may include: (1) a bump portion 152a; and (2) a capping film portion 152b. In accordance with some embodiments, a given bump portion 152a may reside, at least in part, within an opening 150' formed in dielectric layer 150 and may be in physical contact with an underlying RDL 148. A given bump portion 152a may have a capping film portion 152b formed over it, in accordance with some embodiments.

Surface finish layer 152 can be formed from any of a wide variety of suitable materials and using any suitable technique or combination of techniques. For instance, consider Table 1 below, which lists some example suitable materials and associated techniques for forming surface finish layer 152 (e.g., bump portion 152a and/or capping film portion 152b), in accordance with some embodiments:

TABLE 1

| | |
|---|---|
| A1. | Electroless deposition: Cobalt phosphide (CoP)/ |
| A2. | Immersion plating: Gold (Au) |
| B1. | Electroless deposition: Cobalt tungsten phosphide (CoWP)/ |
| B2. | Immersion plating: Gold (Au) |
| C1. | Electroless deposition: Nickel phosphide (NiP)/ |
| C2. | Immersion plating: Gold (Au) |
| D1. | Electroless deposition: Nickel phosphide (NiP)/ |
| D2. | Electroless deposition: Palladium (Pd)/ |
| D3. | Immersion plating: Gold (Au) |
| E1. | Electroless deposition: Tin (Sn) |
| F1. | Electroless deposition: Nickel phosphide (NiP)/ |
| F2. | Electroless deposition: Tin (Sn) |
| G1. | Electroless deposition: Cobalt tungsten phosphide (CoWP)/ |
| G2. | Electroless deposition: Tin (Sn) |
| H1. | Electroless deposition: Copper (Cu)/ |
| H2. | Electroless deposition: Cobalt phosphide (CoP)/ |
| H3. | Immersion plating: Gold (Au) |

TABLE 1-continued

| | |
|---|---|
| I1. | Electroless deposition: Copper (Cu)/ |
| I2. | Electroless deposition: Cobalt tungsten phosphide (CoWP)/ |
| I3. | Immersion plating: Gold (Au) |
| J1. | Electroless deposition: Copper (Cu)/ |
| J2. | Electroless deposition: Nickel phosphide (NiP)/ |
| J3. | Immersion plating: Gold (Au) |
| K1. | Electroless deposition: Copper (Cu)/ |
| K2. | Electroless deposition: Nickel phosphide (NiP)/ |
| K3. | Electroless deposition: Palladium (Pd)/ |
| K4. | Immersion plating: Gold (Au) |
| L1. | Electroless deposition: Copper (Cu)/ |
| L2. | Electroless deposition: Tin (Sn) |
| M1. | Electroless deposition: Copper (Cu)/ |
| M2. | Electroless deposition: Nickel phosphide (NiP)/ |
| M3. | Electroless deposition: Tin (Sn) |
| N1. | Electroless deposition: Copper (Cu)/ |
| N2. | Electroless deposition: Cobalt tungsten phosphide (CoWP)/ |
| N3. | Electroless deposition: Tin (Sn) |

It should be noted, however, that the present disclosure is not so limited to these example compositions and techniques for forming surface finish layer 152, as in a more general sense, surface finish layer 152 may be customized, for example, depending upon which chip-to-chip solder material(s) and/or chip-to-chip attachment methods are employed for a given target application or end-use. Other suitable materials and/or techniques for forming surface finish layer 152 will depend on a given application and will be apparent in light of this disclosure.

Furthermore, the dimensions of surface finish layer 152 can be customized as desired for a given target application or end-use. For example, in some embodiments, the bump portion 152a of surface finish layer 152 may have a thickness (e.g., height) in the range of about 2.0-4.0 μm (e.g., about 2.0-3.0 μm, about 3.0-4.0 μm, or any other sub-range in the range of about 2.0-4.0 μm). In some cases, neighboring bump portions 152a may be separated by a distance in the range of about 30-400 μm (e.g., about 30-120 μm, about 120-210 μm, about 210-300 μm, about 300-400 μm, or any other sub-range in the range of about 30-400 μm). In some embodiments, the capping film portion 152b of surface finish layer 152 may have a thickness, for example, in the range of about 50-200 nm (e.g., about 50-100 nm, about 100-150 nm, about 150-200 nm, or any other sub-range in the range of about 50-200 nm). In some instances, the capping film portion 152b of surface finish layer 152 may have a substantially uniform thickness over the topography provided, for example, by any underlying layers of IC 100 (e.g., bump layer 152a and/or dielectric layer 150). In some instances, the capping film portion 152b of surface finish layer 152 may be provided as a substantially conformal layer over such topography. In some other instances, the capping film portion 152b of surface finish layer 152 may be provided with a non-uniform or otherwise varying thickness over such topography. For example, in some cases a first portion of the capping film portion 152b of surface finish layer 152 may have a thickness within a first range while a second portion thereof has a thickness within a second, different range. Other suitable dimensions for surface finish layer 152 (bump portion 152a; capping film portion 152b) will depend on a given application and will be apparent in light of this disclosure.

It should be noted, however, that the present disclosure is not so limited only to providing IC 100 with a surface finish layer 152. For example, in accordance with some embodiments, one or more flip-chip bumps (e.g., controlled collapse chip connections, or C4) optionally may be provided over IC 100 instead of a surface finish layer 152. When utilized, a given flip-chip bump can be formed from any suitable electrically conductive material (or combination of such materials). For example, in some cases, a given flip-chip bump may be formed from: tin (Sn); copper (Cu); indium (In); gold (Au); a lead-tin (Pb—Sn) alloy; a tin-silver (Sn—Ag) alloy; a tin-silver-copper (Sn—Ag—Cu) alloy; a tin-copper (Sn—Cu) alloy; and/or a combination of any one or more thereof. Also, as will be appreciated in light of this disclosure, a given flip-chip bump may be formed using any suitable technique (e.g., a screen-printing process and/or an electroplating process), as typically done. Furthermore, the dimensions of a given flip-chip bump can be customized, as desired for a given target application or end-use. Other suitable materials, configurations, and techniques for forming a given flip-chip bump will depend on a given application and will be apparent in light of this disclosure.

Figure 15:
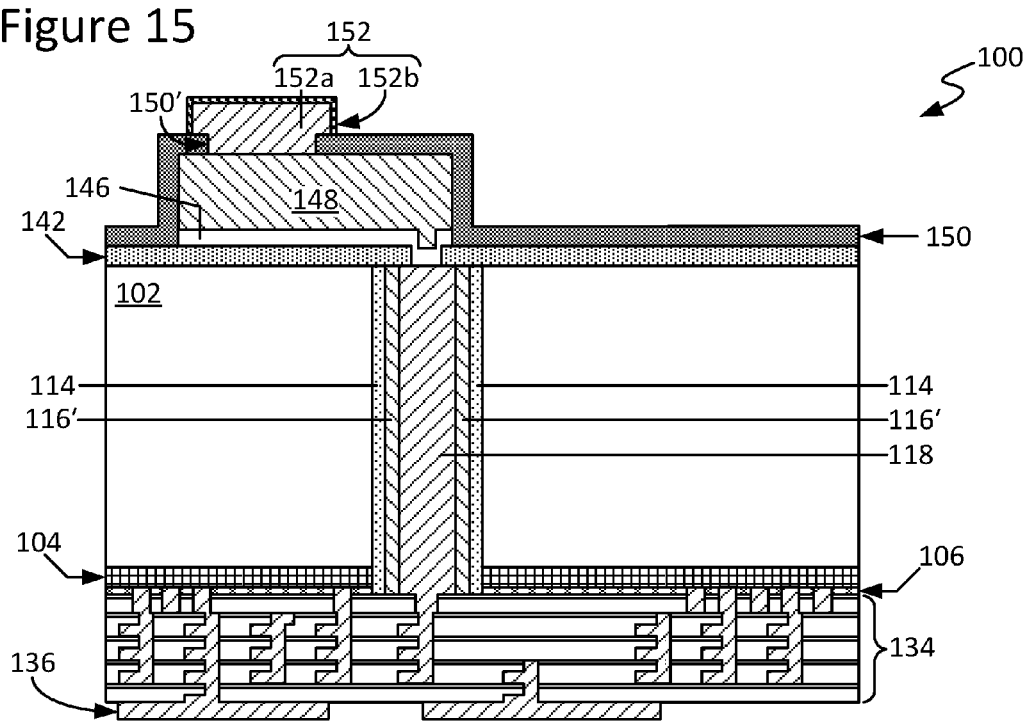
FIG. 15 is a cross-sectional view of the IC of FIG. 14 after de-bonding the carrier substrate, in accordance with an embodiment of the present disclosure.

The process may continue as in FIG. 15, which is a cross-sectional view of the IC 100 of FIG. 14 after de-bonding carrier substrate 140, in accordance with an embodiment of the present disclosure. Carrier substrate 140 can be de-bonded from IC 100 using any suitable processing technique, as typically done. As will be appreciated in light of this disclosure, selection of a given de-bonding technique may depend, at least in part, on the type of adhesive layer 138 utilized (e.g., solvent-release, laser-release, and/or thermal-release). After de-bonding carrier substrate 140, IC 100 may be available for downstream use and/or further processing, as desired. For example, in accordance with some embodiments, IC 100 may provide a structure upon which an additional layer and/or component can be populated.

The disclosed techniques can be used, in accordance with some embodiments, to provide within a semiconductor layer 102 one or more through-body-vias (TBVs) 101 configured for any of a wide variety of electrical connections. For instance, in some embodiments, the interconnect 118 of a TBV 101 may be electronically connected with a RDL 148. In some other embodiments, the interconnect 118 of a TBV 101 may be electronically connected with a back-end layer 134. In some embodiments, the interconnect 118 of a TBV 101 may be electronically connected at two or more locations with a back-end layer 134. In some other embodiments, the interconnect 118 of a TBV 101 may be electronically connected at two or more locations with a RDL 148. In some still other embodiments, the interconnect 118 of a TBV 101 may be electronically connected with a RDL 148 as well as a back-end layer 134. Numerous configurations and combinations will be apparent in light of this disclosure.

Example System

Figure 16:
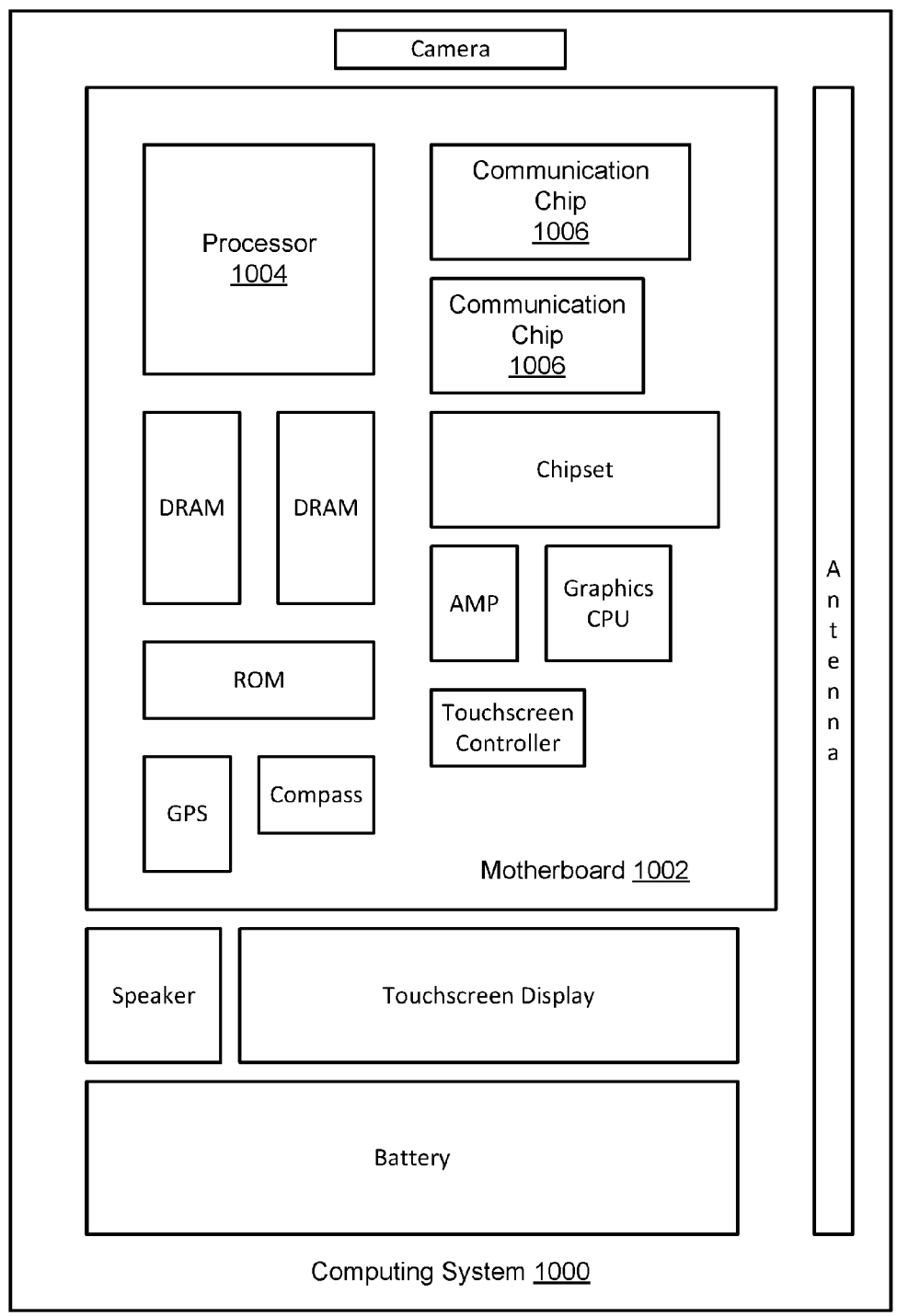
FIG. 16 illustrates a computing system implemented with integrated circuit structures or devices formed using the disclosed techniques in accordance with an example embodiment.

FIG. 16 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a semiconductor layer; and a through-body via (TBV) formed within the semiconductor layer, the TBV including: an electrically conductive interconnect; and a polymer-based barrier layer disposed between the interconnect and the semiconductor layer.

Example 2 includes the subject matter of any of Examples 1 and 3-18, wherein the semiconductor layer includes at least one of silicon (Si) and/or silicon germanium (SiGe).

Example 3 includes the subject matter of any of Examples 1-2 and 4-18, wherein the TBV extends through the semiconductor layer from an upper surface thereof to an opposing lower surface thereof.

Example 4 includes the subject matter of any of Examples 1-3 and 5-18, wherein the interconnect includes at least one of copper (Cu), nickel (Ni), cobalt (Co), and/or a combination of any one or more thereof.

Example 5 includes the subject matter of any of Examples 1-4 and 6-18 and further includes an electrically conductive seed layer disposed between the interconnect and the polymer-based barrier layer.

Example 6 includes the subject matter of Example 5, wherein the seed layer includes at least one of copper (Cu), silver (Ag), and/or a combination of any one or more thereof.

Example 7 includes the subject matter of Example 5, wherein the seed layer and the interconnect are of different material composition.

Example 8 includes the subject matter of Example 5, wherein the seed layer is conformal to the polymer-based barrier layer.

Example 9 includes the subject matter of any of Examples 1-8 and 10-18, wherein the polymer-based barrier layer includes at least one of polyimide, parylene, benzocyclobutene (BCB), polypropylene carbonate (PPC), and/or a combination of any one or more thereof.

Example 10 includes the subject matter of any of Examples 1-9 and 11-18 and further includes a front-end transistor layer formed over a surface of the semiconductor layer.

Example 11 includes the subject matter of any of Examples 1-10 and 12-18 and further includes a metal redistribution layer (RDL) formed over a surface of the semiconductor layer, wherein the RDL is in electronic contact with the TBV.

Example 12 includes the subject matter of any of Examples 1-11 and 13-18 and further includes a back-end layer formed over a surface of the semiconductor layer, wherein the back-end layer is in electronic contact with the TBV.

Example 13 includes the subject matter of Example 12, wherein the back-end layer includes at least one of a wiring layer, a passivation layer, and/or a metal redistribution layer (RDL).

Example 14 includes the subject matter of Example 12, wherein the back-end layer includes a random-access memory device.

Example 15 includes the subject matter of Example 12 and further includes a surface finish layer formed over the back-end layer.

Example 16 includes the subject matter of Example 12 and further includes a metal bump layer formed over the back-end layer.

Example 17 includes the subject matter of Example 16, wherein the metal bump layer includes at least one of a lead-tin (Pb—Sn) solder, a tin-silver (Sn—Ag) solder, a tin-copper (Sn—Cu) solder, gold (Au), copper (Cu), and/or a combination of any one or more thereof.

Example 18 includes the subject matter of any of Examples 1-17 and further includes a carrier substrate bonded thereto.

Example 19 is a method of forming a through-body via (TBV) in a semiconductor layer, the method including: forming a polymer-based barrier layer within the semiconductor layer; forming an electrically conductive seed layer within an interior region bounded by the polymer-based barrier layer; and forming an electrically conductive interconnect within an interior region bounded by the seed layer.

Example 20 includes the subject matter of any of Examples 19 and 21-32, wherein forming the polymer-based barrier layer within the semiconductor layer includes: depositing a layer of at least one of polyimide, parylene, benzocyclobutene (BCB), polypropylene carbonate (PPC), and/or a combination of any one or more thereof within a feature formed in the semiconductor layer; and patterning the resultant layer to cover only one or more sidewalls of the feature.

Example 21 includes the subject matter of Example 20, wherein depositing the layer of at least one of polyimide, parylene, benzocyclobutene (BCB), polypropylene carbonate (PPC), and/or a combination of any one or more thereof involves at least one of a vapor-phase deposition process and/or a spin-on deposition process.

Example 22 includes the subject matter of Example 20, wherein patterning the layer of at least one of polyimide, parylene, benzocyclobutene (BCB), polypropylene carbonate (PPC), and/or a combination of any one or more thereof involves an oxygen ($O_2$)-based plasma etch process.

Example 23 includes the subject matter of any of Examples 19-22 and 24-32, wherein forming the electrically conductive seed layer within the interior region bounded by the polymer-based barrier layer includes: depositing an electrically conductive ink over the polymer-based barrier layer; and curing the ink to form the seed layer.

Example 24 includes the subject matter of Example 23, wherein the electrically conductive ink includes at least one of copper (Cu), silver (Ag), and/or a combination of any one or more thereof.

Example 25 includes the subject matter of Example 23, wherein the electrically conductive ink includes at least one of a nanoparticle-based formulation and/or a metal complex-based formulation.

Example 26 includes the subject matter of Example 23, wherein curing the electrically conductive ink to form the electrically conductive seed layer is performed in an ambient environment of nitrogen ($N_2$).

Example 27 includes the subject matter of any of Examples 19-26 and 28-32 and further includes: forming a front-end transistor layer over the semiconductor layer.

Example 28 includes the subject matter of any of Examples 19-27 and 29-32 and further includes: forming a back-end layer over the semiconductor layer, polymer barrier layer, electrically conductive seed layer, and interconnect, wherein the back-end layer is in electronic contact with the interconnect.

Example 29 includes the subject matter of Example 28 and further includes: bonding a carrier substrate to the back-end layer.

Example 30 includes the subject matter of any of Examples 19-29 and 31-32 and further includes: electronically coupling the interconnect with a redistribution layer (RDL).

Example 31 includes the subject matter of Example 30 and further includes: forming a surface finish layer over the RDL.

Example 32 is an integrated circuit formed using the method including the subject matter of any of Examples 19-31.

Example 33 is an integrated circuit including: a first semiconductor die; and a second semiconductor die electronically coupled with the first semiconductor die by a through-body via (TBV) formed within the second semiconductor die, the TBV includes: an electrically conductive via extending through the second semiconductor die from an upper surface thereof to an opposing lower surface thereof; and a barrier layer disposed between the via and the second semiconductor die, wherein the barrier layer includes at least one of polyimide, parylene, benzocyclobutene (BCB), polypropylene carbonate (PPC), and/or a combination of any one or more thereof.

Example 34 includes the subject matter of any of Examples 33 and 35-39, wherein the second semiconductor die includes at least one of silicon (Si) and/or silicon germanium (SiGe).

Example 35 includes the subject matter of any of Examples 33-34 and 36-39, wherein the via includes at least one of copper (Cu), nickel (Ni), cobalt (Co), and/or a combination of any one or more thereof.

Example 36 includes the subject matter of any of Examples 33-35 and 37-39 and further includes an electrically conductive seed layer disposed between the via and the barrier layer, wherein the seed layer is conformal to the barrier layer.

Example 37 includes the subject matter of Example 36, wherein the electrically conductive seed layer includes at least one of copper (Cu), silver (Ag), and/or a combination of any one or more thereof.

Example 38 includes the subject matter of Example 36, wherein the electrically conductive seed layer and the via are of different material composition.

Example 39 includes the subject matter of any of Examples 33-38, wherein the TBV is electronically coupled with at least one of a redistribution layer (RDL) and/or a back-end layer.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a semiconductor layer consisting essentially of a semiconductor material; and
   a through-body via (TBV) formed within the semiconductor layer, the TBV comprising:
      an electrically conductive interconnect consisting essentially of one or more metal materials; and
      a polymer-based barrier layer consisting essentially of one or more polymer materials between the interconnect and the semiconductor layer, such that the one or more polymer materials is in direct contact with the semiconductor material, and the one or more polymer materials is also in direct contact with the one or more metal materials.

2. The integrated circuit of claim 1, wherein the semiconductor layer comprises at least one of silicon (Si) and/or silicon germanium (SiGe), and wherein the interconnect comprises at least one of copper (Cu), nickel (Ni), cobalt (Co), and/or a combination of any one or more thereof.

3. The integrated circuit of claim 1, wherein the electrically conductive interconnect includes an electrically conductive seed layer and an interconnect layer, the electrically conductive seed layer between the interconnect layer and the polymer-based barrier layer.

4. The integrated circuit of claim 3, wherein the seed layer comprises at least one of copper (Cu), silver (Ag), and/or a combination of any one or more thereof.

5. The integrated circuit of claim 3, wherein the seed layer and the interconnect layer are of different material composition.

6. The integrated circuit of claim 3, wherein the seed layer is conformal to the polymer-based barrier layer.

7. The integrated circuit of claim 1, wherein the polymer-based barrier layer comprises at least one of polyimide, parylene, benzocyclobutene (BCB), polypropylene carbonate (PPC), and/or a combination of any one or more thereof.

8. The integrated circuit of claim 1 further comprising a front-end transistor layer formed over a surface of the semiconductor layer.

9. The integrated circuit of claim 1 further comprising a metal redistribution layer (RDL) formed over a surface of the semiconductor layer, wherein the RDL is in electronic contact with the TBV.

10. The integrated circuit of claim 1 further comprising a back-end layer formed over a surface of the semiconductor layer, wherein the back-end layer is in electronic contact with the TBV.

11. The integrated circuit of claim 1 further comprising a carrier substrate bonded thereto.

12. A method of forming a through-body via (TBV) in a semiconductor layer consisting essentially of a semiconductor material, the method comprising:
   forming a polymer-based barrier layer consisting essentially of one or more polymer materials within the semiconductor layer;
   forming an electrically conductive seed layer within an interior region bounded by the polymer-based barrier layer; and
   forming an electrically conductive interconnect within an interior region bounded by the seed layer, such that the one or more polymer materials is in direct contact with the semiconductor material, and the one or more polymer materials is also in direct contact with the electrically conductive seed layer.

13. The method of claim 12, wherein forming the polymer-based barrier layer within the semiconductor layer comprises:
   depositing a layer of at least one of polyimide, parylene, benzocyclobutene (BCB), polypropylene carbonate (PPC), and/or a combination of any one or more thereof within a feature formed in the semiconductor layer; and
   patterning the resultant layer to cover only one or more sidewalls of the feature.

14. The method of claim 13, wherein depositing the layer of at least one of polyimide, parylene, benzocyclobutene (BCB), polypropylene carbonate (PPC), and/or a combination of any one or more thereof involves at least one of a vapor-phase deposition process and/or a spin-on deposition process.

15. The method of claim 13, wherein patterning the layer of at least one of polyimide, parylene, benzocyclobutene (BCB), polypropylene carbonate (PPC), and/or a combination of any one or more thereof involves an oxygen ($O_2$)-based plasma etch process.

16. The method of claim 12, wherein forming the electrically conductive seed layer within the interior region bounded by the polymer-based barrier layer comprises:
   depositing an electrically conductive ink over the polymer-based barrier layer; and
   curing the ink to form the seed layer.

17. The method of claim 16, wherein the electrically conductive ink comprises at least one of copper (Cu), silver (Ag), and/or a combination of any one or more thereof.

18. The method of claim 16, wherein the electrically conductive ink comprises at least one of a nanoparticle-based formulation and/or a metal complex-based formulation.

19. The method of claim 16, wherein curing the electrically conductive ink to form the electrically conductive seed layer is performed in an ambient environment of nitrogen ($N_2$).

20. An integrated circuit formed using the method of claim 12.

21. An integrated circuit comprising:
   a first semiconductor die; and
   a second semiconductor die consisting essentially of a semiconductor material, the second semiconductor die electronically coupled with the first semiconductor die by a through-body via (TBV) formed within the second semiconductor die, the TBV comprising:
      an electrically conductive via consisting essentially of one or more metal materials, the electrically conductive via extending through the second semiconductor die from an upper surface thereof to an opposing lower surface thereof; and
      a barrier layer consisting essentially of one or more polymer materials between the electrically conductive via and the second semiconductor die, wherein the one or more polymer materials include at least one of polyimide, parylene, benzocyclobutene (BCB), polypropylene carbonate (PPC), and/or a combination of any one or more thereof, such that the one or more polymer materials is in direct contact with the semiconductor material, and the one or more polymer materials is also in direct contact with the one or more metal materials.

22. The integrated circuit of claim 21, wherein the second semiconductor die comprises at least one of silicon (Si) and/or silicon germanium (SiGe), and wherein the electrically conductive via comprises at least one of copper (Cu), nickel (Ni), cobalt (Co), and/or a combination of any one or more thereof.

23. The integrated circuit of claim 21, wherein the electrically conductive via includes an electrically conductive seed layer and a via layer, the electrically conductive seed layer between the via layer and the barrier layer, wherein the seed layer is conformal to the barrier layer, and wherein the electrically conductive seed layer comprises at least one of copper (Cu), silver (Ag), and/or a combination of any one or more thereof.

24. The integrated circuit of claim 23, wherein the electrically conductive seed layer and the via layer are of different material composition.

25. The integrated circuit of claim 21, wherein the TBV is electronically coupled with at least one of a redistribution layer (RDL) and/or a back-end layer.

* * * * *